United States Patent
Chang

(10) Patent No.: US 8,041,884 B2
(45) Date of Patent: Oct. 18, 2011

(54) CONTROLLER FOR NON-VOLATILE MEMORIES AND METHODS OF OPERATING THE MEMORY CONTROLLER

(75) Inventor: Chee Keng Chang, Singapore (SG)

(73) Assignee: Chee Keng Chang, Singapore (SG)

( * ) Notice: Subject to any disclaimer, the term of this patent is extended or adjusted under 35 U.S.C. 154(b) by 596 days.

(21) Appl. No.: 12/093,661

(22) PCT Filed: Nov. 13, 2006

(86) PCT No.: PCT/SG2006/000345
§ 371 (c)(1), (2), (4) Date: May 14, 2008

(87) PCT Pub. No.: WO2007/058624
PCT Pub. Date: May 24, 2007

(65) Prior Publication Data
US 2008/0270680 A1    Oct. 30, 2008

(30) Foreign Application Priority Data
Nov. 17, 2005  (WO) ................. PCT/SG2005/000391

(51) Int. Cl.
*G06F 12/00* (2006.01)
(52) U.S. Cl. .................... 711/103; 365/185.33
(58) Field of Classification Search ............. 711/103; 365/185.33
See application file for complete search history.

(56) References Cited

U.S. PATENT DOCUMENTS

| | | | | |
|---|---|---|---|---|
| 5,905,993 A * | 5/1999 | Shinohara | ...................... | 711/103 |
| 7,328,301 B2 * | 2/2008 | Eilert et al. | ................... | 711/103 |
| 2004/0168018 A1 * | 8/2004 | Aasheim et al. | .............. | 711/103 |
| 2005/0144368 A1 * | 6/2005 | Chung et al. | .................. | 711/103 |
| 2005/0251617 A1 * | 11/2005 | Sinclair et al. | ................ | 711/103 |
| 2006/0224818 A1 * | 10/2006 | Stewart | ......................... | 711/103 |
| 2006/0282644 A1 * | 12/2006 | Wong | ............................ | 711/206 |
| 2007/0083697 A1 * | 4/2007 | Birrell et al. | .................. | 711/103 |

* cited by examiner

*Primary Examiner* — Hashem Farrokh
(74) *Attorney, Agent, or Firm* — Bracewell & Giuliani LLP

(57) ABSTRACT

A non-volatile memory system (3) is proposed consisting of a first non-volatile flash memory (5) having a plurality of blocks, each block having a plurality of pages, each block being erasable and each page being programmable, and a second non-volatile random access memory (23) having a plurality of randomly accessible bytes. The second non-volatile memory (23) stores data for mapping logical blocks to physical blocks and status information of logical blocks. Each logical block has an associated physical page pointer stored in the second non-volatile memory (23) that identifies the next free physical page of the mapped physical block to be written. The page pointer is incremented after every page write to the physical block, allowing all physical pages to be fully utilized for page writes. Furthermore, a method of writing and reading data is disclosed whereby the most recently written physical page associated with a logical address is identifiable by the memory system without programming flags into superseded pages, or recording time stamp values in any physical page or block of the first non-volatile memory (5). Furthermore, a method is provided for a logical block to be mapped to two physical blocks instead of one to provide additional space for page writes, resulting in reduction in page copy operations, thereby increasing the performance of the system.

39 Claims, 23 Drawing Sheets

L2P_STRUCT[5]

| PM | PRI_PAGE | PRI_PHY_BLK |
|---|---|---|
| 2 | 8 | 2 |

SA_STRUCT[0]

| SA_MAP | SA_PAGE | SA_PHY_BLK |
|---|---|---|
| 1 | 0 | 6 |
| | 5 | |
| | SA_LGC_BLK | |

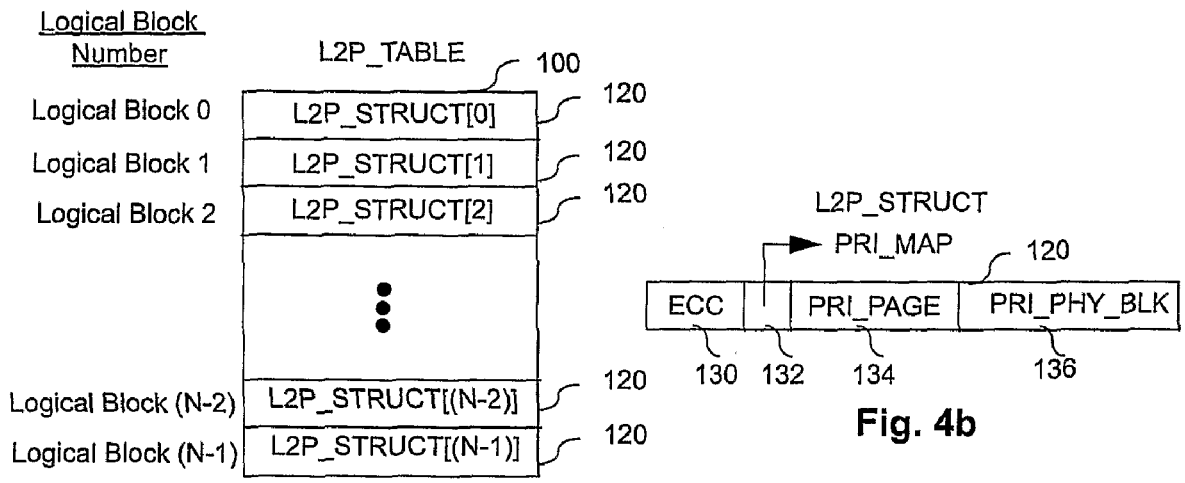
Fig. 4a
Fig. 4b
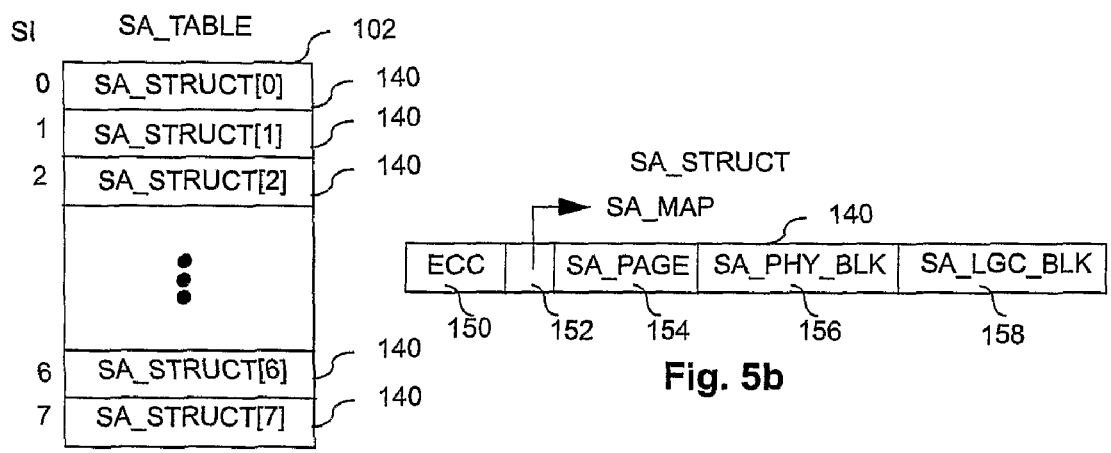
Fig. 5a
Fig. 5b

BSTAT: Block Status
LPM: Logical Page Map
LPN: Logical Page Number
OECC: Overhead ECC
DECC: Data ECC

CONTROLLER FOR NON-VOLATILE MEMORIES AND METHODS OF OPERATING THE MEMORY CONTROLLER

FIELD OF THE INVENTION

This invention relates to a data storage system employing a solid state (i.e. semiconductor-type) non-volatile memory, such as a flash memory, and methods of operating such a memory. In particular, it relates to the construction, architecture and techniques of a flash memory controller for accessing such a non-volatile flash memory.

BACKGROUND OF THE INVENTION

Flash memory is a form of EEPROM (Electrically Erasable and Programmable Read Only Memory) that allows multiple memory locations to be erased or written in one programming operation. The memory is commonly used as a mass data storage subsystem for electronic devices, such as memory cards, USB (Universal Serial Bus) flash drives and solid-state drives as replacements of hard disk drives.

A flash memory device consists of one or more arrays of transistor cells as its data storage units. Each of those cells is capable of keeping one or more bits of data even if the electric power supply is cut off. Therefore, a flash memory is termed a non-volatile memory because it does not require an external power supply to retain stored data. However, this also requires that previously stored data is erased once a new round of programming or data input is required. This process is termed an erase-before-write, which is often time-consuming.

In commercial applications, a large number of transistor cells are divided into physical blocks, pages and sectors for their address management to facilitate data access, storage and programming. A flash memory is generally organized into a plurality of physical blocks. Each of these blocks is divided into a plurality of physical pages. Within each physical page, memory is often divided into two portions for the storage of user data and overhead data. Overhead data is commonly used to store the user data's status and flags, to record logical address information, error correction code, etc. Overhead data is sometimes also termed spare area or redundant data. FIG. 1 shows an example of a flash memory 5 having M blocks 50 (labeled 0 to M−1), each block 50 being organized into G pages 60 (labeled 0 to G−1), and each page 60 being further divided into user data 70 and overhead data 72 portions.

In one commercial implementation, a flash memory device consists of a number of blocks of 16 KB each. Every block is further divided into 32 pages, each page is then able to store 512 bytes of data equal to the size of a host sector. In another commercial implementation, a flash memory device consists of blocks of 128 KB each, a page size of 2 KB, such that a block is composed of 64 pages, and a page is composed of 4 sectors. In addition, each page also contains additional non-volatile cells for storing overhead data. These flash memory devices are herein termed multi-paged block flash memories, since every block is organized into a plurality of pages.

Programming flash memory is usually done in one or more pages, which is typically less than a block size. Moreover, in one commercial implementation (e.g., some NAND flash memories), pages within a block must be programmed in order from the least significant page to the most significant page. Random page programming within the block is prohibited.

To avoid the operation of erase-before-write, the concept of logical and physical addresses has been introduced. The physical address denotes the actual location or address of a group of transistor cells while the logical address means an address recognized by a host and which is logically associated to a physical address. A read/write operation for a logical address requested from a host end is converted into a read/write operation for an actual physical address of a flash memory by several steps of mapping algorithms. This mapping algorithm is often performed by a device termed a flash memory controller. The challenge for such a flash memory controller is how to optimize the flash memory controller system architecture to improve data access speed, to utilize the flash memory blocks and pages more efficiently and to improve on the reliability and usage life of the flash memories.

FIG. 2 shows a flash memory controller attached to the host at one interface and flash memories at another interface. The flash memory controller and its attached flash memories are semiconductor devices and they form a non-volatile semiconductor mass storage system together. FIG. 2 shows internal blocks of a typical flash memory controller with only major blocks shown for clarity. A host 1 communicates with a flash memory controller 3, which is arranged to access a non-volatile memory consisting of one or more physically-separate flash memory devices 5. The communication between the flash controller 3 and the host 1 is via a host interface 7. The communication between the controller 3 and the memory devices 5 is via a flash interface 9. The controller 3 further includes a ECC logic unit 13, a buffer RAM 11 and a processor 15. The processor 15 operates making use of temporary memory provided by a system volatile RAM 17 and a processor RAM 19, and software stored in a ROM 21.

In a typical process of operation for the device illustrated in FIG. 2, the host 1 initiates a data transfer operation by sending commands to the flash controller 3. A host write command specifies the starting logical address to write along with the number of sectors to write. A host read command specifies the starting logical address to read from along with the number of sectors to read.

User data is typically transferred between host and flash memories through the buffer RAM 11. The host uses logical addresses to read or write data. One of the functions of the controller 3 is to translate the host logical addresses into flash memory physical addresses so that data can be stored in proper storage cells/transistors.

The host logical address is often translated into intermediate terms of logical block and logical page addresses, where a logical block comprises a plurality of logical pages. There are various methods to perform this translation based on different flash memory controller implementations and algorithms. For example, the controller may map the upper host logical address bits to a logical block, and the rest of the lower host logical address bits to logical pages. The controller then maps the logical block and logical pages to physical block and physical pages. As an example, a logical block may be organized into 64 logical pages in sequential address order, such that logical block 0 is page-addressable from logical address 0 to 63, logical block 1 is page-addressable from logical address 64 to 127, logical block 2 is page-addressable from logical address 128 to 191, and so on. A logical block may be mapped to one or more physical blocks, and each logical page of this logical block may be mapped to a physical page of the mapped physical block(s). The controller then issues a sequence of low-level commands and control signals to read or write to flash memories using the mapped physical addresses. Host logical addresses and their corresponding terms of logical blocks and logical pages are virtual concepts, whereas physical blocks and physical pages are the real physical locations within flash memories.

Typically, the system volatile RAM 17 incorporated into the controller is used for storing the logical to physical address mapping and other system information. On power up, the controller is required to read mapping information from the flash memory 5 (typically in flash overhead data) and initialize the system volatile RAM 17 prior to any data transfer operation.

Other functions performed by the controller includes ECC (error correcting codes) generation and checking, error recovery, erasing blocks that contain obsolete data, performing wear-leveling function to improve on flash block usage, and others.

When a flash memory having multi-paged blocks is used, data in less than all the pages of a block is usually required to be updated by programming the new data in unused pages of either the same or another block. However, an efficient mapping algorithm for flash memories having multi-paged blocks has still not been satisfactorily developed. The following explains some of the fundamental challenges faced by a flash memory controller design for multi-paged block flash memory.

When a host writes N number of pages (where $N \geq 1$) of user data starting at a specific logical address to the storage device, the controller must implement some methods for mapping the logical address to flash physical address. The flash physical address is a function of the physical block number and physical page number. This address pair is herein denoted as {physical block, physical page}. The controller has to decide, for each of the N pages, in which {physical block, physical page} to store the user data. When the host subsequently reads data from the logical address previously written to, the controller must be able to translate the logical address to its mapped physical address, which is used to access specific location in flash memory and return the user data to the host.

Secondly, when the host updates M number of pages to the same logical address (where $M \leq N$), the controller has to map the logical address to physical address for each of the M pages. The challenge is that a flash physical page must be erased before it can be written to again. Most present controllers implement methods to write user data to a different {physical block, physical page} than was previously written to for the same logical address. This requires the controller to re-map the logical address to a different {physical block, physical page} for each of the M pages for updates. When host subsequently reads data from the logical address, the controller must be able to translate the logical address to the physical address of the most recently written location to retrieve valid data, such that the older user data mapped to the same logical address are superseded.

Thirdly, host may be required to update to the same logical address multiple times, and each time with different user data from the previous writes.

Finally, when power for the non-volatile mass storage system is turned off and subsequently turned on again, the controller must be able to retain all the mapping information.

There are many controller designs to fulfill these functional requirements in order to make data access, storage, and transfer efficiently.

In a very early design, a host logical block is always mapped to a fixed flash physical block. In other words, every time the host writes to the same logical block, user data is always stored to the same flash physical block. However, prior to writing to the flash block, the flash block must first be erased. The disadvantage of this scheme is that any write is always slowed down by the time-consuming erase operation.

To address this, one prior art proposal was to avoid the "erase-before-write" scheme by re-writing user data to an erased physical block, and recording its associated logical block in the overhead data with a new flag. The previous data in the old block is marked using an old flag. In this scheme, the logical block number may be different from its mapped physical block number. However, for a flash memory having multi-paged blocks, the logical pages are always mapped to fixed physical pages within the block.

One disadvantage of this scheme is when host updates one or more pages of a logical block, a new erased physical block must be allocated for storing new data. Next, the valid pages of user data that were not over-written must be copied from the original block to the assigned erased physical block. The original physical block must then be invalidated by writing an old flag in its overhead data. Both the copying of pages and invalidating original block demand additional operation and time. Often times, the original block is invalidated even when not all the pages have been fully used, resulting in less efficient block usage. The more frequent block erase due to less efficient block usage will cause a drop in reliability since each flash block has limited program/erase cycles beyond which failure may occur. Additionally, the time consuming block erase may cause a performance penalty, even though it may be mitigated by performing erase in the background.

An improvement was made to avoid the copying of valid pages during updates. This is done by tagging the newly assigned erased physical block as a "moved" block. In fact, up to two physical blocks are used, one is the original block, and another is a moved block. Additional information is used to indicate whether a valid page is located in the original block, or the moved block. However, in this scheme, the logical pages are still associated with fixed physical pages within the blocks. Since the scheme has only one level of "moved" block, the process of copying valid pages and invalidating the "moved" block is still required when there are more than two updates to the same logical page. As before, this demands additional operation and time, results in less efficient block usage and more erase cycles to be performed.

In another attempt for flash controller design, the logical pages can be mapped to any physical pages within the mapped physical block. Hence, the logical to physical address mapping is done on a finer granularity. Tags in the overhead data associate a {logical block, logical page} with a {physical block, physical page}. To handle updates, instead of marking the original superseded page as old, the controller uses a time stamp written in the overhead data as an indication of which is the most recently written data. Two implementations are outlined. In both implementations, a physical block may be shared for data of different logical blocks.

In the first implementation, a time stamp is recorded in every physical page that was written. If a logical page is updated multiple times, user data will be stored in physical pages whose overhead data will have the same {logical block, logical page} tag but with different time stamps. On power up, for the controller to locate the most recently written page, it is expected that the controller reads the overhead data of all the flash physical pages, compares the logical addresses and time stamps to identify most recently written pages containing valid data.

In the second implementation, the controller is only required to record a time stamp for physical blocks instead of recording in every physical page. The time stamp is required to identify the one valid page, since, in its generalized form, data updates for same {logical block, logical page} may be written to pages of different physical blocks, and each physical block may also be shared with data of other logical blocks. The most recently written physical page is determined by the relative physical location within a block. The implementation requires a reverse reading technique to dynamically identify if a logical page has been re-written and generally requires a large buffer to re-assemble the user data prior to transferring them to the host in the correct order.

In both implementations, a real time clock or a modulo counter is required to generate a time value that is to be recorded in flash memory blocks or pages. This time stamping operation is expected to add complexity to the flash memory controller, such as having to generate time-stamp values, handling of wrap around cases, and to perform time-stamp comparison among pages having common logical addresses.

Another type of non-volatile memory that attracts much research attention is Non-Volatile Random Access Memory (NVRAM). Random Access Memory (RAM) is classified as volatile memory and has faster data access speed as it is based on a different type of technology and does not require erase-before-write operation. Currently, NVRAM is created by attaching a backup battery to a volatile random access memory. In this case, unlike a normal Random Access Memory (RAM), the data stored in a NVRAM is kept even if the external electric power supply (other than the battery) is switched off because the backup battery holds the electric charges required. RAM has much faster data transfer speed than ROM and the same applies to NVRAM.

Recently developed NVRAMs based on various technologies do not require the aid of a battery to keep stored data. These include Magneto-Resistive Random Access Memory (MRAM), Ferroelectric Random Access Memory (FRAM), Ovonic Unified Memory (OUM), and others currently under development. These solid-state memories are sometimes referred to as "next generation" or "universal" or "nano-technology" non-volatile memories and have properties similar to SRAM with additional feature of being non-volatile.

Similar to flash memory, these NVRAMs do not require power to retain data. There are however, major functional differences between flash memory and Non-Volatile Random Access Memory that provide NVRAM with advantages over flash memory as follows:

Contents in NVRAM are randomly addressable for read and write in minimum unit of a byte.

The process of writing and reading data in NVRAM is faster and it completes in one short read or write cycle. For flash memory, programming data will incur a long busy period during which time the state of the non-volatile memory cells are changed. For some flash implementation (e.g. NAND flash), reading data will incur a long busy period during which time the data from non-volatile memory cells are read.

Updating a specific byte location in NVRAM can be performed multiple times and it does not require erasing that byte prior to the update.

Writing any byte is allowed at any address with no limitations on the allowable address due to prior history of writes, unlike some flash memory (e.g. NAND flash) that imposes restrictions on programming in sequential page addresses within a block.

The term NVRAM as used here encompasses any solid-state non-volatile random access memory having at least some functional characteristics (preferably all) as described above, including MRAM, FRAM, OUM and others based on various technologies, some of which are still under research and development. The disadvantage of NVRAM is that at the current time, it is still more expensive than flash memory in terms of cost per MB. Hence, it is not expected to completely replace flash memory as the non-volatile memory of choice in mass storage applications in the near future.

Ongoing design and manufacturing improvements are bringing NAND flash memory to the next level of performance. Process shrinks are providing flash memory devices with multi-gigabit storage densities as well as faster read access. In addition, architectural innovations are boosting the speeds of erasure and programming as well as read access. These improvements have provided a roadmap that will bring NAND flash performance to new levels that further increase their utility in modern computing system designs.

SUMMARY OF THE INVENTION

The present invention aims to provide a new and useful controller for a memory system (also referred to herein as a "memory device"), as well as a new and useful memory system employing the controller and new and useful methods performed by the controller.

Among possible advantages provided by some embodiments of the invention are more efficient flash block and page utilization, improvement of operational speeds by reducing page copy operations, and simplified and efficient operations such as identifying the most recently written pages containing valid data.

A first aspect of the present invention proposes a memory system having a non-volatile solid-state memory for storing user data, and a non-volatile memory for storing contents for mapping logical block to physical blocks and pages in the non-volatile flash memory and mapping status information.

Thus, the memory system has two types of non-volatile memory. The first non-volatile memory is a solid-state (e.g. flash) memory for storing user data. The flash memory is organized into a plurality of blocks, each block having a plurality of pages, each block being erasable and each page being programmable and stores a page of user data. The second non-volatile memory may be at least partly a non-volatile random access memory (NVRAM). The NVRAM comprises a plurality of bytes, each byte being randomly accessible and each byte being writable and readable as a unit. Each byte can be updated multiple times without prior erase. Embodiments of the invention make use of the properties of non-volatile random access memory to maintain mapping status and tags or flags. The status and tag bits can be updated multiple times with new values, thus allowing for status bits to transition from one state to another state.

By contrast, the practice in certain prior art devices is to maintain status and flag bits in the overhead data of flash memory. This has a number of disadvantages. Updating flags in flash memory is slow and will have a negative impact on performance. Secondly, updating flags generally requires re-writing to the same overhead data area that was previously written. This may produce an undesirable effect of potentially affecting the state of adjacent memory cells that had been previously written, as in the case of some types NAND flash memories implemented using multi-level cells that store more than one bit per cell.

The NVRAM contains tables of system structures to describe the mapping and state of each logical block, such as mapping to physical blocks and pages, and so on. During the course of operation, the controller will read or update the relevant contents of this NVRAM.

A second aspect of the invention proposes, in general terms, that in a memory system having a non-volatile solid-state memory for storing user data, logical blocks are mapped to a corresponding physical block. A respective pointer for each logical block indicates a page of the corresponding physical block to which data can next be written, and second mapping data is maintained storing data indicating for each logical page of the logical block the physical page of the corresponding physical block to which data was last written. A write operation in relation to a logical page of the logical block is performed by using the respective pointer to identify a physical page of the physical block, writing the data to that page, and updating the pointer and the second mapping data accordingly. The present invention makes it possible to use successive pages of the physical block to store data, even in cases in which data in respect of a given logical page is written to repeatedly.

The second mapping data is stored in memory that is non-volatile to maintain its mapping in the event of power loss. This may be at least partly in NVRAM and/or it may be at least partly in the overhead data. It is presently preferred that it is stored in the overhead data. In this latter case at least some of the second mapping data may be stored also (i.e. duplicated) in volatile RAM memory.

In the case that at least part of the second mapping data is stored (perhaps duplicated) in overhead data of the solid-state memory, the term "updating" is to be understood as including the case in which some data in the overhead data is superseded by data newly written to other portions of the overhead data.

Note that at intervals (e.g. periodically, and/or when a certain condition is found to be met) a logical copy operation may be performed in which the data in the physical block is copied to a new physical block, and corresponding pointer and second mapping data are updated in respect of new physical block.

This logical copy operation may be performed, for example, when the condition is met that the pointer indicates that all physical pages in the physical block corresponding with the respective logical block having been written.

Alternatively, when this physical block fullness condition is met in respect of the first physical block (e.g. when the first physical block is actually full, i.e., all the physical pages of the first physical block have been written), optionally, the logical block may be mapped additionally to a second physical block, so that writing may continue into pages of the second physical block. The logical copy operation may thereby be postponed, e.g. until all pages of the second physical block have been used.

This concept of mapping a second physical block to a given logical block constitutes an independent third aspect of the present invention. According to this third aspect, the present invention proposes, in a memory system having a non-volatile solid-state memory for storing user data, and in which logical blocks are mapped to corresponding physical blocks such that data to be written to logical pages of the logical block is stored in physical pages of the corresponding first physical block, that upon a physical block fullness condition being met in respect of a first physical block (e.g. that all the pages of the physical block have been written to), an additional physical block (second physical block) is associated with the corresponding logical block, and data to be written to pages of that logical block is subsequently written to pages of the second physical block.

The association between a logical block and a second physical block is performed when the condition occurs that all the pages of the first physical block have been written and more page writes are required for the logical block. However, the controller may optionally associate a logical block with a second physical block prior to all the physical pages of the first physical block having been written, in anticipation of future writes. In this case, writes to the logical block continues into pages of the primary physical block until all the pages have been written, and subsequent writes to the logical block will then utilize physical pages of the associated secondary physical block.

The three aspects of the invention are independent, but can be used together in any combination. Typical embodiments of the invention employ all three aspects of the invention.

Although the expressions above are in terms of the case in which logical blocks are the same in size as physical blocks (e.g. store the same amount of user data), the expressions will be understood by an expert to applying also to the case in which logical blocks and physical blocks are of different sizes, and a set of one of more logical blocks has the same size as a set of one or more physical blocks. In this case, the mappings explained above are not between individual logical blocks and individual physical blocks, but between sets of logical blocks and corresponding sets of physical blocks.

In addition to the three aspects of the invention described above, the present invention proposes specific methods of performing non-volatile flash memory access operations that work in conjunction with various logical to physical mapping and status information stored in the non-volatile random access memory, and may allow one or more of the following to be accomplished.

Firstly, a method of operation is established whereby the physical pages of mapped physical block(s) are substantially utilized for storing user data. In other words, for a logical block comprising a plurality of logical pages, the logical block being mapped to a physical block, substantially all the physical pages of the mapped physical block can be used to store user data when writing to any logical page belonging to the logical block, regardless of logical page addresses. Said differently, the method does not require mapping a logical page to fixed physical page within the mapped physical block(s). Page pointers identify the next physical pages to be written. This method allows the pages of physical blocks to be fully and efficiently utilized for page writes, reduces the number of page copy operations required to move valid pages from original block to a new block, and reduces the frequency of placing superseded blocks for erasure, resulting in improved performance and reliability.

Secondly, updates to the same logical page are handled the same way as writing to any other logical page, since there is no fixed logical page to physical page mapping. This avoids the requirement of allocating a new block to store the user data for logical page updates, as would be the case if logical pages were to be mapped to fixed physical pages within a block. Furthermore, it avoids having to copy un-superseded pages from the original block to the new block.

Thirdly, a method is established for identifying the most recently written physical page associated with a logical page by using a combination of status tag bits in the non-volatile random access memory and the relative order of programming the pages within a physical block, without having to program and update flags in superseded physical pages, or having to record time value in any of the physical pages or blocks in the flash memory. This avoids having additional programming steps to update flags which slows the operation for updates, and avoids implementing a real-time clock or a modulo counter to maintain time value of programming.

Fourthly, a method of reading programmed physical pages is established by using the contents of the non-volatile random access memory and a volatile random access memory that keeps track of the most recently written physical page numbers, without requiring reverse order reads to identify superseded pages.

Fifthly, a logical block can be mapped to not just one but two physical blocks. The contents in the non-volatile random access memory identifies whether a logical block has been mapped to any physical block, mapped to one physical block or mapped to two physical blocks. The pages within the two mapped physical blocks are substantially utilized for storing user data, regardless of the logical page addresses to be written. Mapping a logical block to two physical blocks doubles the number of page writes that can be performed for the logical block before page copy operation is required to reclaim and allocate new space for further page writes. In effect, this results in a further reduction in page copy operations, thereby further increasing the performance of the system.

Sixthly, the status of each physical block is maintained in non-volatile random access memory. In particular, a status byte associated with a physical block can be updated multiple times with new values as the block cycles through its different stages of uses, such as erased (free), used, old or bad. The use of the non-volatile random access memory allows this to be performed efficiently, since the locations are randomly accessible and has the properties of allowing multiple updates to same status bits. In contrast, maintaining status information in such a manner in some types of flash memories (such as multi-state cell NAND flash memories) will have various limitations imposed on updating same or adjacent locations in overhead data.

Seventhly, logical copy operations are used to copy pages from original mapped blocks to new mapped block(s) when the pages of the original mapped blocks are fully utilized. This has the effect of allowing further page writes to the new mapped block(s).

Eighthly, the controller is able to handle power off and power on where part of the system information is lost. The present invention makes possible retention of logical to physical mapping data in both NVRAM and physical page overhead, and has a scheme to reconstruct such mapping on power-up, including ability to handle reconstruction for updates to the same logical page.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIG. 4a is a first table for defining a logical-to-physical block mapping structure (L2P_TABLE).

FIG. 4b is an L2P_STRUCT structure, which is an entry of the L2P_TABLE.

FIG. 5a is a second table for defining a secondary logical-to-physical mapping structure (SA_TABLE).

FIG. 5b is a SA_STRUCT structure, which is an entry of the SA_TABLE.

DETAILED DESCRIPTION OF PREFERRED EMBODIMENTS

Figure 1:
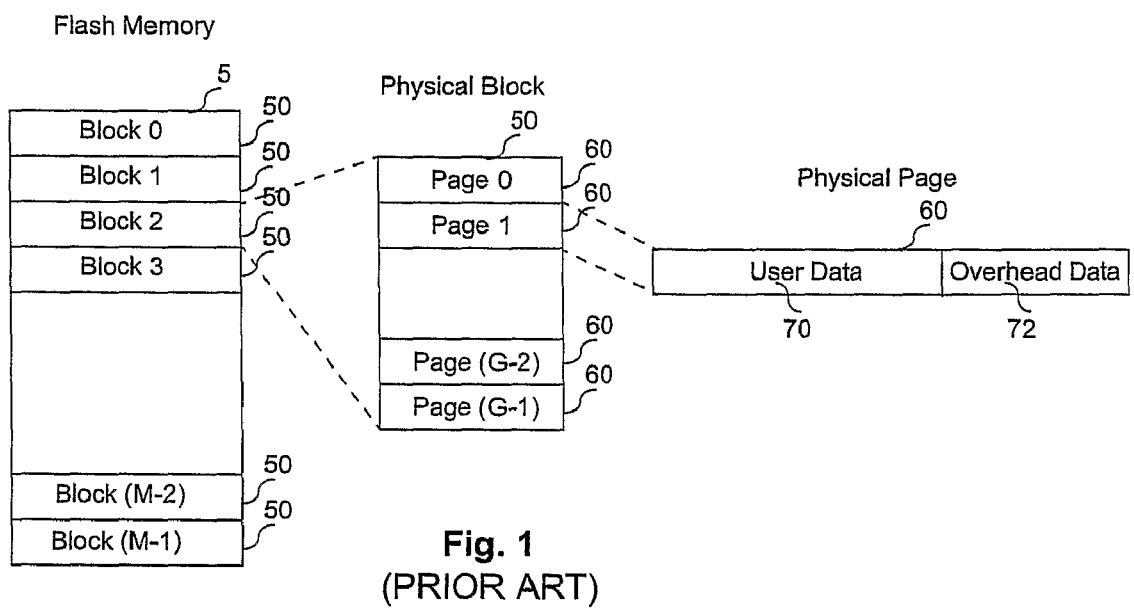
FIG. 1 is a diagram showing flash memory organization, where each block is organized into a plurality of pages.
Figure 2:
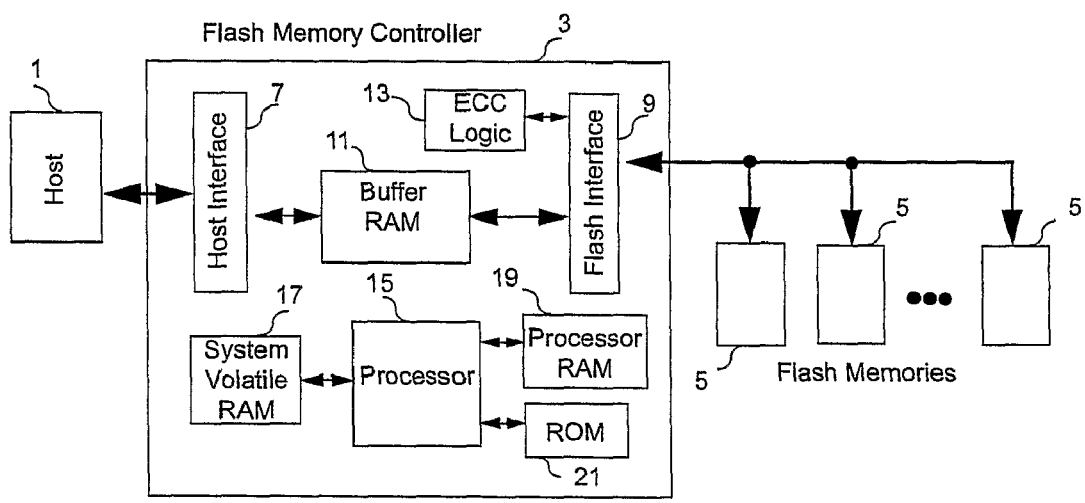
FIG. 2 is a diagram of known flash memory controllers and typical internal blocks.
Figure 3A:
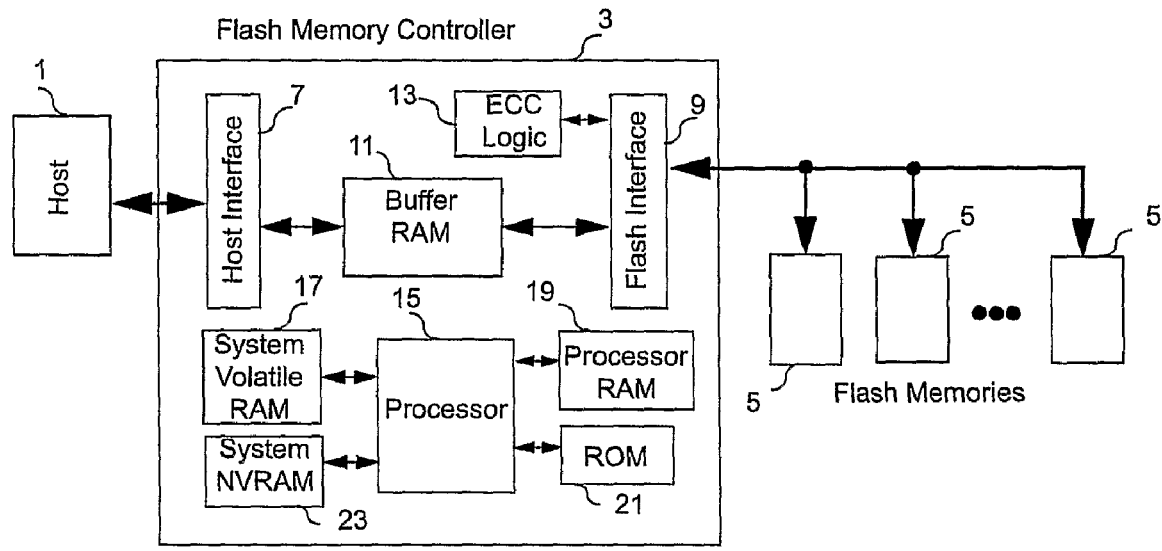
FIG. 3a is a diagram showing a flash memory system, which is an embodiment of the present invention.

An embodiment of the present invention will now be described. The flash memory system typically has blocks shown in FIG. 3a, and the corresponding elements of the embodiment are given the same reference numbers as in FIG. 2. All elements shown in FIG. 3a are the same as FIG. 2, except that there is an additional system NVRAM memory device 23 incorporated into the flash controller. In FIG. 3a, the system NVRAM 23 is illustrated as a component within the flash controller 3, e.g. provided as part of a single integrated circuit which also integrates the other components of the flash controller 3. However, optionally, the NVRAM memory device 23 may be an external component connected to the flash controller 3 via a dedicated interface port.

One possible form of the embodiment is to assemble the flash controller 3 and the flash memories 5 into a single physical unit such as a memory card or a flash drive, and the interface to the host 1 (e.g. a personal computer) comprises a mating physical connector and a socket. Alternative embodiments of the present invention may include embedding the controller 3 into at least a portion of the host system 1, e.g., in the form of a highly-integrated application-specific integrated circuits (ASIC). In such an embodiment, the embedded flash controller 3, integrated as a unit in the ASIC, together with the external flash memories form a non-volatile memory system, and the physical mating connector and socket are not required. In this embodiment, further optimization includes simplifying the host interface 7 and potential sharing of processor 15, volatile RAM 17 and NVRAM 23 with other functions of the host system.

The present architecture includes a number of improvements including more efficient flash physical block and physical pages utilization, improves on operational speeds by reducing page copy operations, and generally has simplified and efficient steps for various operations including identifying the most recently written page containing valid data.

Figure 3B:
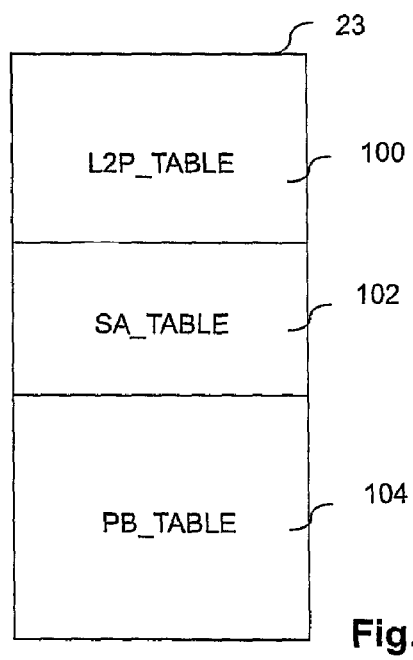
FIG. 3b is a diagram of some partitions of the system NVRAM of the embodiment.
Figure 3C:
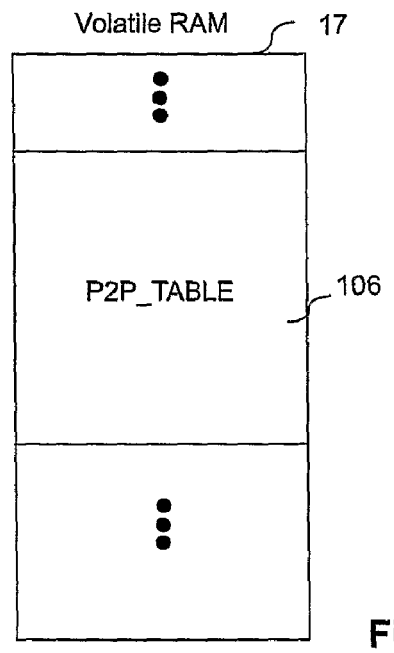
FIG. 3c is a diagram of some partitions of the system Volatile RAM of the embodiment.

To achieve these improvements, the methods of operation of the flash controller make use of a number of mapping structures (data structures) stored in the NVRAM 23 and the volatile RAM 17 as shown in FIGS. 3b and 3c. For convenience of discussions, they are called L2P_TABLE 100, SA_TABLE 102, PB_TABLE 104 and P2P_TABLE 106. In one embodiment, L2P_TABLE 100, SA_TABLE 102 and PB_TABLE 104 are stored in NVRAM while the page lookup table P2P_TABLE 106 is either stored in the NVRAM or the volatile RAM. In the present embodiment, the page lookup table P2P_TABLE 106 is stored in volatile RAM whose contents are lost on power-off.

The L2P_TABLE 100 and SA_TABLE 102 are initialized to an initial state of all zeros during controller/flash memory device production prior to the system being used for any user application, which corresponds to an initial state of no mapping for any logical addresses.

L2P_TABLE 100 is a table containing an array of elements referred to as L2P_STRUCT 120 as detailed in FIGS. 4a and 4b. SA_TABLE 102 is a table containing an array of elements referred to as SA_STRUCT 140 as detailed in FIGS. 5a and 5b. P2P_TABLE 106 is a page lookup table containing an array of elements referred to as P2P_STRUCT 160, and each P2P_STRUCT 160 contains an array of sub-entries of fields SRC_MAP 170 and SRC_PAGE 172, as detailed in FIGS. 6a and 6b. PB_TABLE 104 is a table containing an array of elements PB_STAT 180, giving information on physical block status, as detailed in FIGS. 7a and 7b.

FIG. 4a shows a first table called L2P_TABLE 100 of an array of L2P_STRUCT 120 (logical to physical block mapping structure) structures, each structure uniquely addressable by a logical block number and associated with the logical block. FIG. 4a shows an example of the L2P_TABLE 100 that supports N logical blocks, numbered from 0 to (N−1), which is the logical space of the flash memory system accessible by the host 1, thus, if a logical block is 128K bytes of addressable space, the logical space of the flash memory system accessible by the host is (128K*N). Each L2P_STRUCT 120 contains information to map a logical block to one or two physical blocks. This is to say that the L2P_STRUCT 120 allows the controller to translate a given logical address to a physical address. An L2P_STRUCT 120 comprises the fields ECC 130, PRI_MAP 132, PRI_PAGE 134 and PRI_PHY_BLK 136. Here, PRI_MAP 132 is tag indicating the mapping type of the logical block;

PRI_PAGE 134 is a pointer to the next free physical page to be written in the primary physical block, called the primary page pointer;

PRI_PHY_BLK 136 is the primary physical block that is mapped to the logical block; and ECC 130 is error correction codes (an optional field)

In addition to mapping a logical block to physical block(s), the L2P_STRUCT 120 is designed to allow all the physical pages of mapped physical block(s) to be utilized for storing user data. In other words, for a logical block comprising a plurality of logical pages, the logical block being mapped to a physical block, substantially all the physical pages of the mapped physical block are used to store user data when writing to any logical page belonging to the logical block, regardless of logical page addresses. The primary page pointer associated with the logical block identifies the next physical page of the primary physical block to be written in response to writing any logical page of the logical block. The page pointer is then incremented to point to the next available free page. In this method, updates to the same logical page are handled the same way as writing to any other logical page, since there is no fixed logical page to physical page mapping.

This method allows all the pages of physical blocks to be fully utilized for page writes before having to perform the time consuming page copy operations to move valid pages from original block to a new erased block, and reduces the frequency of placing superseded blocks for erasure. The result is an improvement on system performance and reliability.

The ECC 130 field is used in all NVRAM system structures for error correction in case where the NVRAM 23 has limited write or read endurance. One example of an ECC 130 implementation is the use of a Hamming Code. ECC 130 may optionally be left out if the NVRAM 23 is of unlimited endurance or if its endurance is deemed sufficient for the usage life of the memory system. For the interest of clarity, NVRAM ECC 130 will be left out when explaining system structures in subsequent discussions.

FIG. 5a shows a second table called SA_TABLE 102 of an array of SA_STRUCT 140 (secondary block structure) structures. When used, an SA_STRUCT 140 describes a mapping of a logical block to a secondary physical block, in addition to the primary physical block. This is to say that a logical block can be mapped to two physical blocks by using both an L2P_STRUCT 120 structure and an SA_STRUCT 140 structure. Mapping a logical block to two physical block doubles the number of page writes that can be performed for the logical block before page copy operation is required to reclaim and allocate new space for further page writes. This further reduces page copy operations resulting in further increase in system performance.

An SA_STRUCT 140 comprises the fields ECC 150, SA_MAP 152, SA_PAGE 154, SA_PHY_BLK 156 and SA_LGC_BLK 158. Here, SA_MAP 152 (secondary map tag) is a tag indicating whether this SA_STRUCT 140 is used. If SA_MAP=1, this SA_STRUCT 140 is used, otherwise, it is unused.

SA_PAGE 154 is a pointer to the next free physical page to be written in the secondary physical block, called the secondary page pointer;

SA_PHY_BLK 156 is the secondary physical block mapped to its associate logical block.

SA_LGC_BLK 158 is the logical block associated with this SA_STRUCT 140, if SA_MAP=1.

Similar to the primary page pointer, the secondary page pointer identifies the next physical page of the secondary physical block to be written. This allows all the pages of the secondary physical block to be fully utilized, reduces the number of page copy, reduces the frequency of placing superseded blocks for erasure, resulting in improved performance and reliability. (With minor changes to L2P_STRUCT 120 and SA_STRUCT 140 structures, the page pointer SA_PAGE 154 may be omitted, and one pointer, e.g. the PRI_PAGE 134 field, extended by 1-bit, may be used to indicate the next free physical page, i.e., if the extended bit is 0, it points to a page in first physical block, and if the extended bit is 1, it points to a page in the second physical block.)

There is generally a limited number of SA_STRUCT 140 used in a system so as to limit the maximum number of physical blocks to be allocated as spare storage blocks, leaving the majority of the physical blocks for mapping to logical address space.

This example shows only eight SA_STRUCT 140 (see FIG. 5a), meaning that up to eight physical blocks can be allocated for use as secondary blocks. In general, if there are S number of SA_STRUCT 140, then up to S number of physical blocks can be allocated for use as secondary blocks. In this case, a maximum of S number of logical blocks can each be mapped to two physical blocks, with a total of (S×2) number of physical blocks having been allocated for the S number of logical blocks.

In practice, the controller may be configured to have any number of SA_STRUCT 140 and allocate up to corresponding number of physical blocks for use as secondary blocks. The trade-off is that if the system uses more physical blocks for spare storage, it will result in less physical blocks for mapping to logical address space.

The PRI_MAP 132 tag indicates how the logical block is mapped. The embodiment maps a logical block to one or two physical blocks as indicated by the state of its associated PRI_MAP 132 field as follows:

PRI_MAP=0: logical block is unmapped, i.e. no physical block has been allocated to logical block;

PRI_MAP=1: logical block is mapped to a primary physical block;

PRI_MAP=2: logical block is mapped to both a primary physical block and a secondary physical block;

A PRI_MAP 132 tag having a value of 2 indicates that a logical block is mapped to two physical blocks: a primary physical block and a secondary physical block. This logical block will then be associated with one SA_STRUCT 140. The SA_LGC_BLK 158 field of this SA_STRUCT 140 will contain the logical block number which it is associated with.

In the non-volatile memory system of the present invention, some logical blocks may not be mapped (PRI_MAP=0), some logical blocks may be mapped to one physical block (PRI_MAP=1), and some logical blocks may be mapped to two physical blocks (PRI_MAP=2).

At any one time, the state of a logical block is described by a set of associated system structure fields stored in the non-volatile random access memory, which is termed the current mapping state. In particular, the current mapping state of a logical block is described by its associated L2P_STRUCT 120 and SA_STRUCT 140 (if any) fields:

PRI_MAP 132
PRI_PAGE 134
PRI_PHY_BLK 136
SI (index number of the SA_STRUCT 140 associated with this logical block, if any)
SA_MAP 152 (if any)
SA_PAGE 154 (if any)
SA_PHY_BLK 156 (if any)
SA_LGC_BLK 158 (if any)

The above fields describe:
association of the logical block with a primary physical block, if it is mapped;
association of the logical block with a secondary physical block, if any;
pointer to the next physical page to write when receiving a write access to this logical block.

Figure 8A:
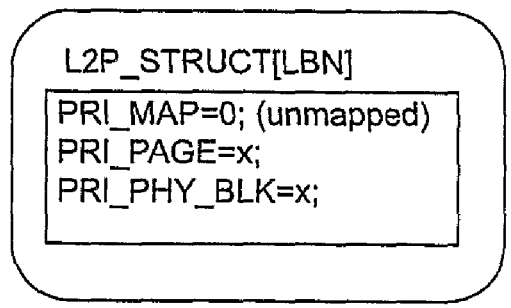
FIGS. 8a, 8b and 8c show various current mapping states of a logical block LBN.
Figure 8B:
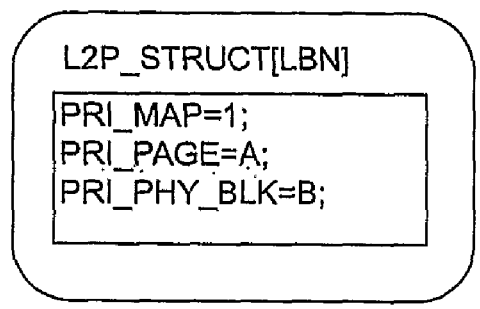
Figure 8C:
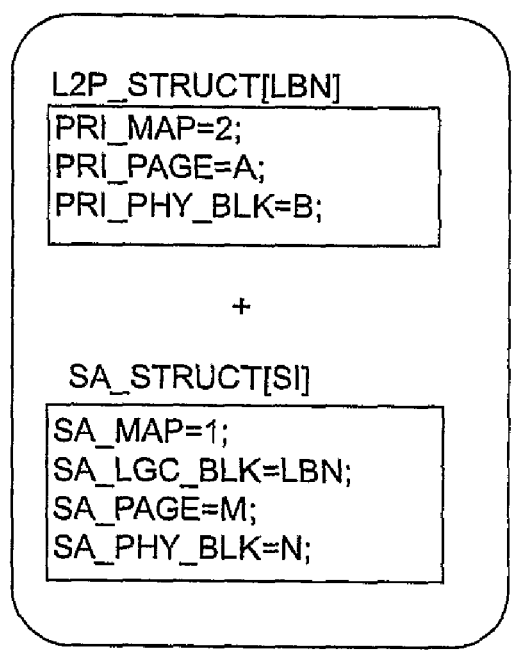

The current mapping states of a logical block LBN and its use for write operations are explained using examples in FIGS. 8a, 8b and 8c:

At the state shown in FIG. 8a, the L2P_STRUCT[LBN] 120 entry of L2P_TABLE 100 states that PRI_MAP=0 indicating that logical block LBN is unmapped, i.e., the logical block LBN has not been allocated a physical block for operation.

At the state shown in FIG. 8b, PRI_MAP=1, logical block LBN is mapped to physical block B, and the primary page pointer indicates the primary page is A. Writing any logical page of LBN will store the user data to {physical block, physical page} of {B, A}.

At the state shown in FIG. 8c, PRI_MAP=2, showing that logical block LBN is mapped to two physical blocks, primary physical block B and secondary physical block N, and the primary page pointer indicates the primary page is A and the secondary page pointer indicates that the secondary page is M. An SA_STRUCT 140 entry of SA_TABLE 102 indexed by SI having the field SA_LGC_BLK=LBN associates this SA_STRUCT 140 with the logical block. In this state, writing any logical page of LBN will store the user data to {physical block, physical page} of {B, A} if the PRI_PAGE has not reached its maximum value (roll over condition), indicating that there is at least one or more free physical page in physical block B. Otherwise, data of LBN will be stored to {physical block, physical page} of {N, M}, a page in the secondary physical block.

(Note that in a variation of the above scheme, which is also an embodiment of the invention, there may be additional PRI_MAP 132 tag states to indicate the relative time order of writes between the primary and secondary physical blocks. For example, while PRI_MAP=2 indicates that pages in the primary block are written earlier followed by pages in the secondary block, a tag of PRI_MAP=3 may indicate that pages in the secondary block are written earlier than the pages in the primary block. In the present discussion, this possible variation is omitted for simplicity).

Figure 6A:
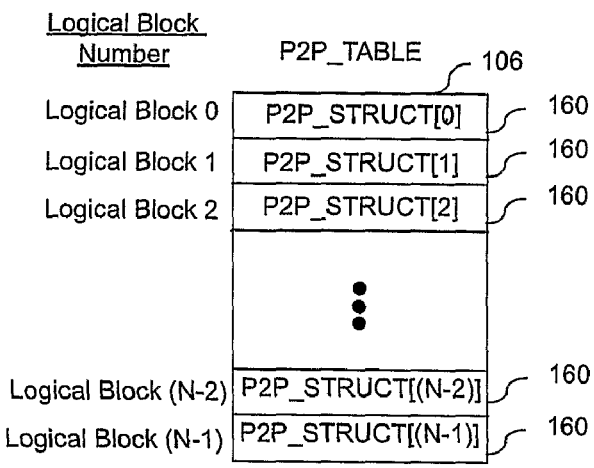
FIG. 6a is a third table functioning as a logical page-to physical page lookup table (P2P_TABLE)
Figure 6B:
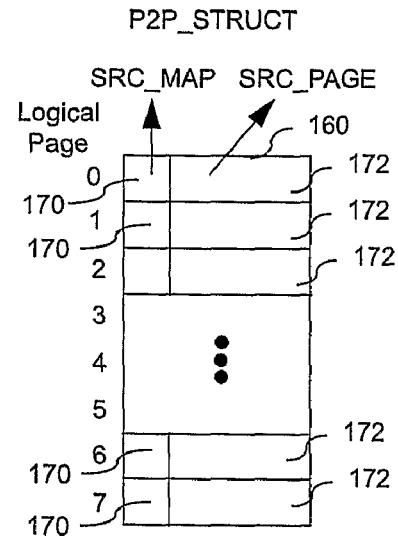
FIG. 6b is a P2P_STRUCT structure, an entry of the P2P_TABLE.

FIG. 6a shows a third table called the P2P_TABLE 106 (page lookup table) comprising an array of elements referred to as P2P_STRUCT 160 (logical page-to-physical page mapping structure) structures, with each P2P_STRUCT 160 further comprising an array of sub-entries of the form {SRC_MAP 170, SRC_PAGE 172} ({source map tag, source physical page number}). Each P2P_STRUCT 160 is uniquely addressable by a logical block number, and each sub-entry of P2P_STRUCT 160, the sub-entry being {SRC_MAP 170 and SRC_PAGE 172}, is uniquely addressable by a logical page number. The logical pages are organized consecutively within a logical block. FIG. 6a shows an example of the P2P_TABLE 106 that supports N logical blocks, numbered from 0 to (N−1), which matches the flash memory system logical space supported by the L2P_TABLE 100. FIG. 6b shows an example where a P2P_STRUCT 160 supports a logical block organized into 8 consecutively addressed logical pages.

In the present embodiment, the size of the address space of a logical block is the same as the size of the address space of a physical block for convenience. In addition, if a physical block contains G pages, then the logical block itself will correspondingly be subdivided into G consecutively addressed logical pages, although the mapping of a logical page to physical page is not fixed with respect to logical page address and page numbers. Alternative embodiments may include organizing a logical block address space to equal a multiple of physical block address space, and/or organizing a logical page address space to equal a multiple of the physical page address space (with corresponding changes and extensions to the mapping structures presented above).

The number of sub-entries in a P2P_STRUCT is dependent on how a block is organized. In general, if a block is organized into N pages, then there will be N sub-entries for each P2P_STRUCT. FIG. 6b shows an example of a P2P_STRUCT having 8 sub-entries organized sequentially from logical page 0 to 7.

The state of a logical page belonging to a logical block is described by its associated sub-entry fields:
SRC_MAP 170 is a tag indicating the mapping type of the logical page
SRC_PAGE 172 indicates the physical page number mapped to the logical page The SRC_MAP 170 field describes the mapping of a logical page belonging to a logical block as follows:
SRC_MAP=0; the logical page is not mapped, i.e., it has not been written yet.
SRC_MAP=1; the logical page is mapped to a physical page in the first physical block (primary physical block) associated with said logical block. This physical page number is recorded in the corresponding SRC_PAGE 172 field.
SRC_MAP=2; the logical page is mapped to a physical page in the second physical block (secondary physical block) associated with said logical block. This physical page number is recorded in the corresponding SRC_PAGE 172 field.

The page lookup table P2P_TABLE 106 is stored in random access memory. In the present embodiment, it is stored in volatile RAM 17 whose data will be lost on power-off. As portions of data in P2P_TABLE 106 are stored in flash memory 5, portions of the P2P_TABLE 106 can be reconstructed on power-on from the corresponding locations of flash memory 5. An alternative is to store the P2P_TABLE 106 in non-volatile RAM 23, however, this is not preferred in the present embodiment due to the higher cost/byte of non-volatile RAM compared to volatile RAM at the present time.

In the course of writing user data to a physical page, the corresponding entry of the P2P_STRUCT 160 is updated. The updated information of the P2P_TABLE 106, together with the L2P_TABLE 100 and SA_TABLE 102, adequately describes the most up-to-date logical to physical block and page mapping. In particular, the P2P_TABLE 106 (together with the states of L2P_TABLE 100 and SA_TABLE 102) enable the controller to identify the most recently written {physical block, physical page} for a logical page, whereby the controller does not have to mark superseded pages as old, or requiring the controller to store time stamp values in any of the physical pages and physical blocks, as were done in some prior art. With this scheme, the process of writing user data and reading stored user data is simplified and improved.

Figure 7A:
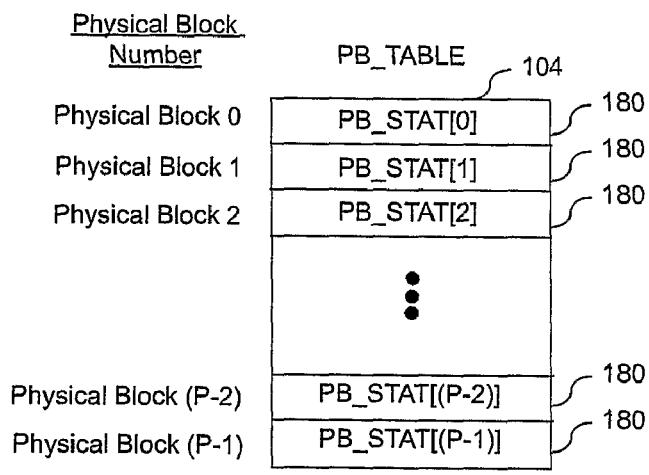
FIGS. 7a, 7b and 7c is a fourth table indicating physical block status (PB_STAT) together with physical block status state transitions.

A fourth table called the PB_TABLE 104 is shown in FIG. 7a. This table contains an array of PB_STAT 180 each uniquely addressable by a physical block number. A PB_STAT 180 describes the status information for physical blocks as follows:
FREE 194 indicates that the block is erased and free to be allocated.
USE 195 indicates that the block has been allocated.
OLD 196 indicates that the block is scheduled to be erased.
BAD 197 indicates that the block is bad and cannot be used.

PB_TABLE 104 describes the status of up to P total number of physical blocks of all flash memories 5 attached to flash controller 3. The PB_TABLE 104 is initialized to indicate the status of corresponding physical blocks 50 of flash memories 5 attached to controller 3 during controller/flash memory system production prior to it being used for any user application. Flash memories 5 are first shipped with the block status, valid (good) or invalid (bad), recorded in a specific location (generally the overhead data) for each physical block, prior to it being used. An invalid block cannot be used for storing user data. The steps involved in initializing the PB_TABLE 104 involve reading, for each physical block, that specific location to obtain the block status, and then initializing the corresponding location PB_STAT 180 of PB_TABLE 104. As flash memories 5 may have invalid/bad blocks prior to shipping, a small percentage of PB_STAT 180 may be marked as BAD 197 prior to the flash memory system being used for any user application.

Figure 7C:
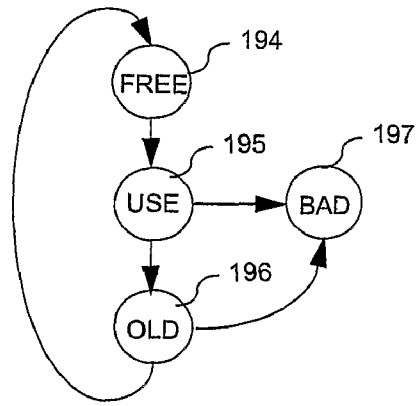
Figure 7B:
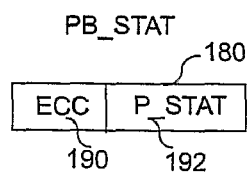

The advantage of maintaining the status of each physical block in NVRAM 23 is that the same status byte location can be updated multiple times with new values without prior erase as the block cycles through its different stages of uses. For example, the status byte will be updated from FREE 194 to USE 195 to OLD 196 and back to FREE 194 again, as the physical block cycles through its usage pattern from being erased, allocated for usage, de-allocated after usage, and later erased for subsequent use again. (The controller will update the status to BAD 197 if an error occurs such as when writing or erasing the block causes an error condition.) The possible status transitions are shown in FIG. 7c. Maintaining the status byte in NVRAM 23 allows this to be done efficiently. In contrast, maintaining status information in such a manner in flash memory will have various limitations imposed on multiple updates to the same or adjacent flash location, as in the case of some types of NAND flash memories implemented using multi-state cells.

It should be apparent that alternative embodiments of organizing the fields of L2P_STRUCT, SA_STRUCT and P2P_STRUCT are possible. For example, instead of having the fields of an L2P_STRUCT grouped together, the fields can be separated into individual tables of their own, such that separate tables are implemented for PRI_MAP, PRI_PAGE and PRI_PHY_BLK, each table having a plurality of entries, each entry being uniquely addressable by logical block number. Likewise, the fields of SA_STRUCT can be separated into individual tables of their own, such that separate tables are implemented for SA_MAP, SA_PAGE, SA_PHY_BLK and SA_LGC_BLK, each table having a plurality of entries, each entry being indexed by a secondary index number.

Figure 9:
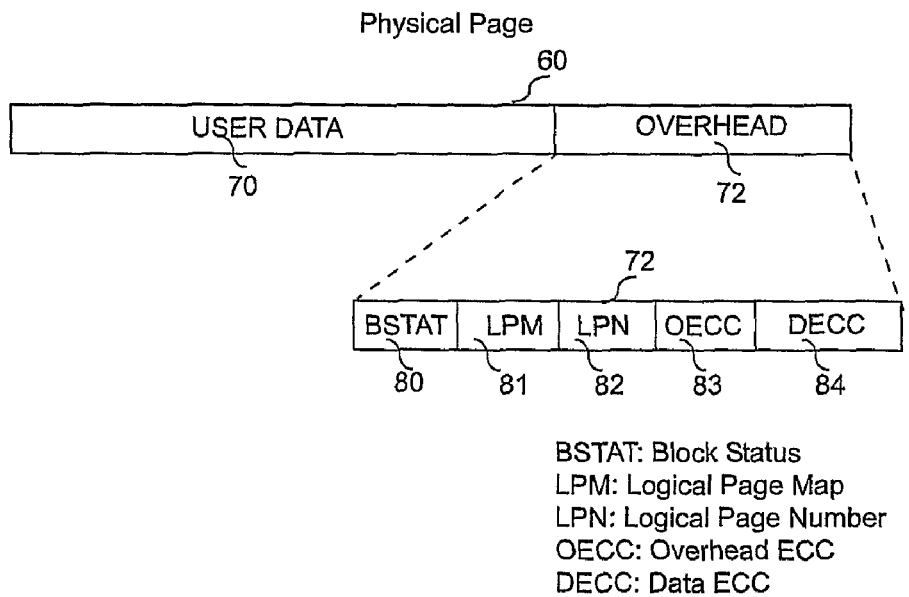
FIG. 9 gives detailed structure of a flash memory physical page and its overhead structure.

The storage of data within the flash memories 5 is illustrated in FIG. 9, which shows the structure for any single one of the physical pages. In addition to the portion of each physical page which stores user data 70, there is an overhead data area 72 of each physical page which stores some mapping information. The overhead data 72 further includes fields for storing block status BSTAT 80, logical page map LPM 81, logical page number LPN 82, user data ECC 84, overhead ECC 83, and other information as necessary. These fields assist the controller/algorithm to associate logical addresses to corresponding physical addresses and enables the controller to manage a flash memory properly, including error correction (data repair) for user data. The properties of the overhead data are as follows:

BSTAT 80 is a tag indicating the status of the physical block;

LPM 81 is a tag indicating the status of a logical page/physical page. If LPM=hex FF, there is no mapping, and the physical page is free; if LPM=hex 00, the LPN 82 field indicates the logical page that is mapped to this physical page;

LPN 82 is the logical page associated with this physical page which is valid only if LPM=hex 00;

DECC 84 is the user data ECC.

OECC 83 is overhead data ECC.

BSTAT 80 may optionally be stored in only one page of a block instead of in all the pages. It should be appreciated that the LPM 81 tag is only one means of indicating that the physical page has been used for storing user data, and other means of such an indication are possible.

The methods and operations of the controller according to present invention will now be explained using following figures based on the above-mentioned system structures. In all these descriptions, for the interest of clarity, the flash memory is shown to have only eight pages per block, and a page of user data is the minimum unit for host read and host write. In all these descriptions, the received host logical addresses have been translated to corresponding logical block and logical pages, where a logical block comprises a plurality of consecutive logical pages. For the interest of clarity, only the LPN field is shown to be stored in the overhead data along with the user data to be programmed, a page of user data being denoted by "DATA x", where x is shown as an alphabet.

Figure 10:
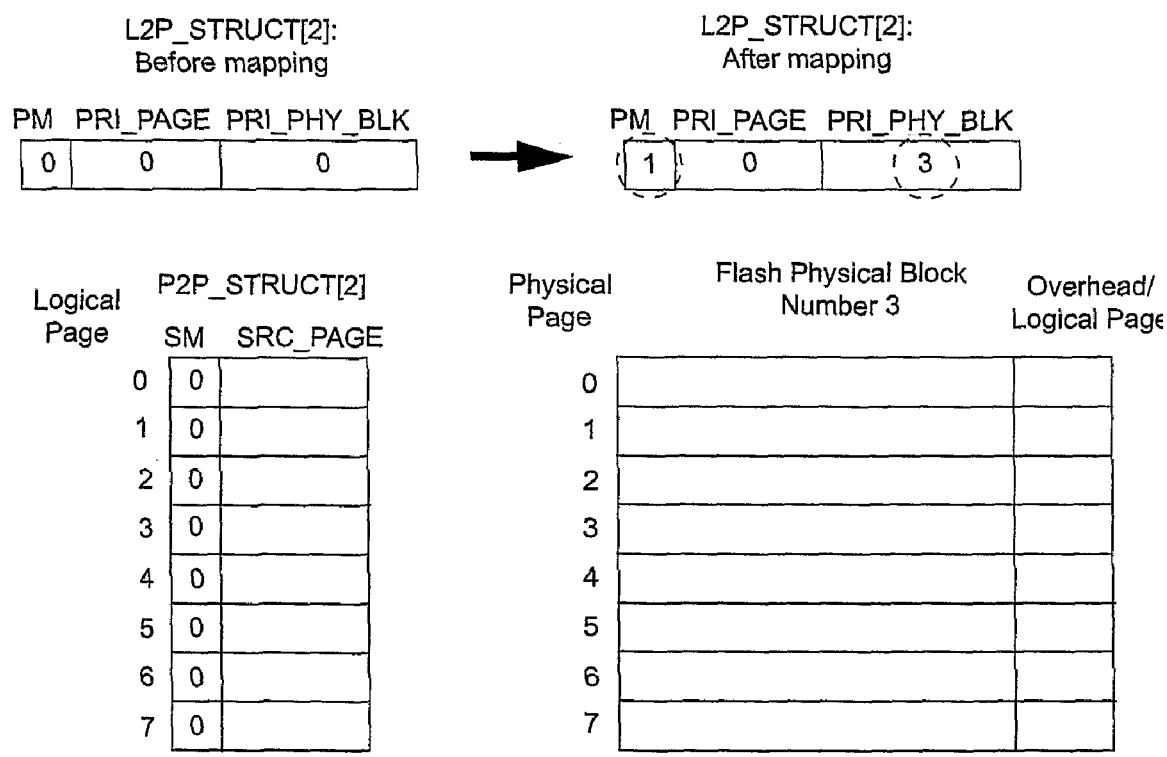
FIG. 10 is an example of a mapping for allocating a physical block to a logical block using entries of L2P_STRUCT and P2P_STRUCT.
Figure 11:
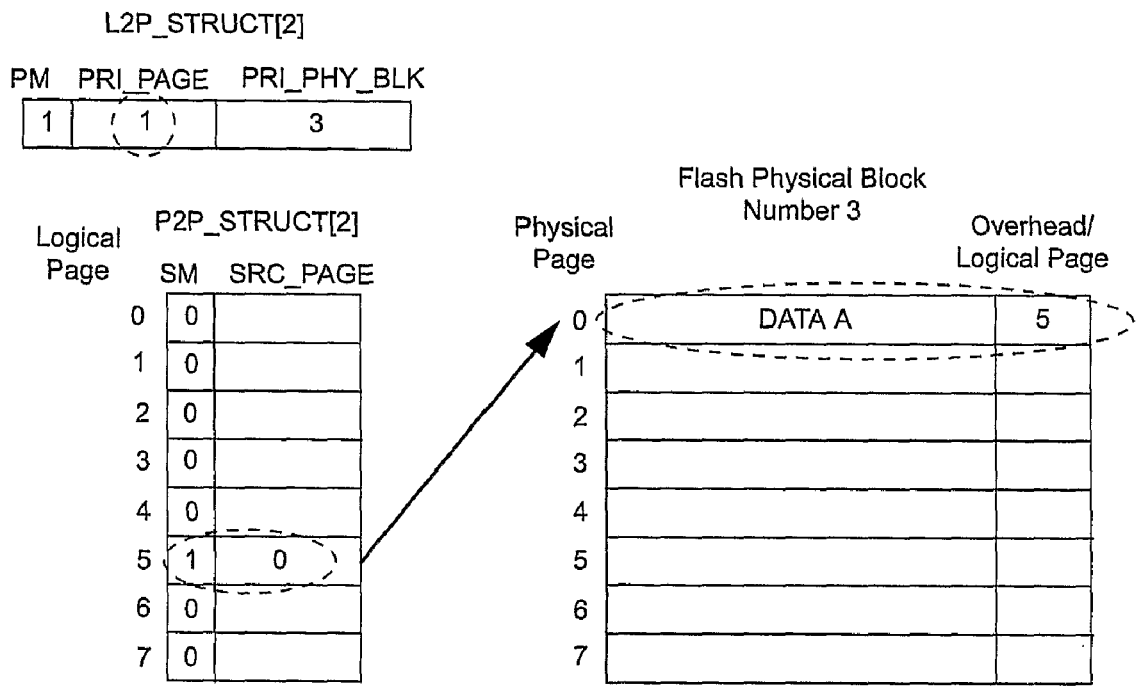
FIG. 11 describes a write operation to logical block 2, logical page 5 using L2P_STRUCT[2] and P2P_STRUCT[2].

FIGS. 10 and 11 show the steps of operations when writing to a logical block that has not been mapped. In these figures, PRI_MAP is denoted more concisely as PM, and SRC_MAP is denoted more concisely as SM. In this example, a page of user data is to be written to {logical block=2, logical page=5}. The initial state of the L2P_STRUCT associated with logical block 2 (denoted by L2P_STRUCT[2]) and of P2P_STRUCT[2] is shown in the left part of FIG. 10, while the initial state of the physical block 3 is shown in the lower right part of FIG. 10. The controller reads L2P_STRUCT[2] and finds that it is not mapped (PRI_MAP=0 or PM=0). Next, the controller allocates an unused erased physical block from its pool of available erased physical blocks for this logical block. In this case physical block number 3 is allocated by initializing the PRI_PHY_BLK field to 3, the primary page pointer PRI_PAGE is initialized to 0, and the PRI_MAP field is changed to 1, as shown in the upper right part of FIG. 10. The logical block is now mapped to physical block 3 and a request for writing a page of user data to logical block 2 will use the page number indicated by PRI_PAGE, which is 0.

Then, as shown in FIG. 11, P2P_STRUCT[2][5] (i.e., the sub-entry corresponding to logical page 5 of logical block 2) is updated to {SRC_MAP, SRC_PAGE} of {1, 0}. This indicates that logical page 5 of logical block 2 is mapped to page 0 of primary physical block (which is physical block 3). The PRI_PAGE field of L2P_STRUCT[2] is next incremented to point to the next available page for any subsequent page write to logical block 2. Next, user data of {logical block=2, logical page=5} is written to {physical block=3, physical page=0}, along with recording the logical page number 5 in the overhead data.

Figure 12:
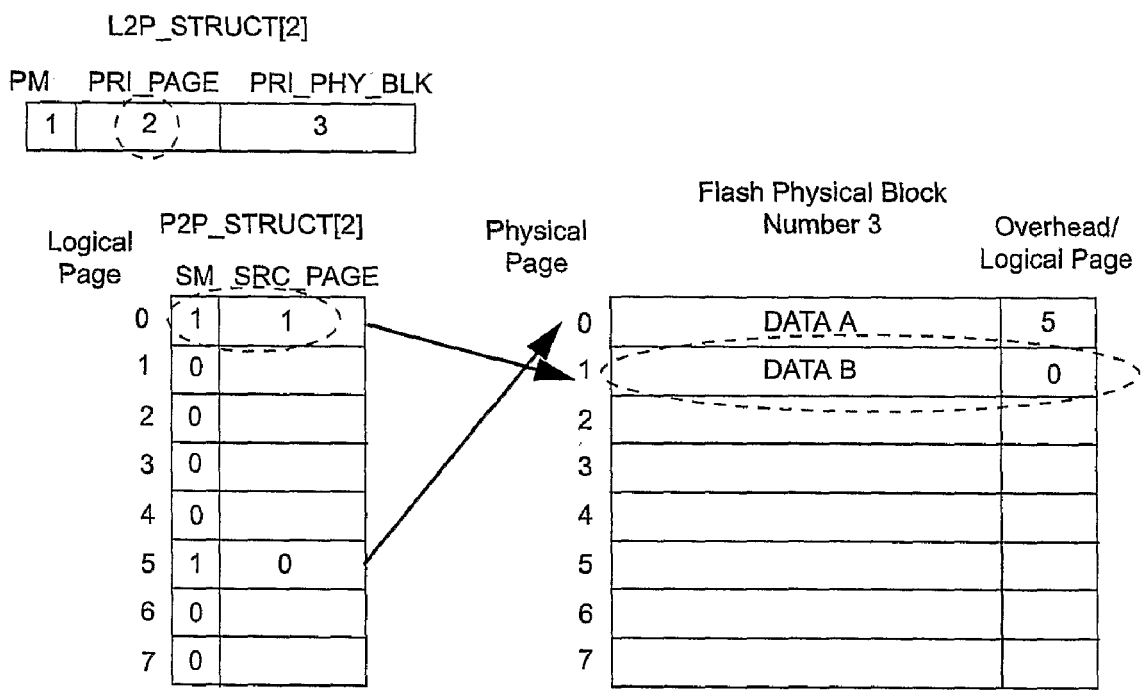
FIG. 12 describes the next write operation to the following physical page in a primary physical block for logical block 2, logical page 0 via using L2P_STRUCT[2] and P2P_STRUCT[2].

Continuing, FIG. 12 shows another example when a page of user data of the same logical block but different logical page {logical block=2, logical page=0} is to be written. Since PRI_MAP equals 1 and PRI_PAGE equals 1, the user data is to be written to {physical block=3, physical page=1}. The P2P_STRUCT[2][0] (i.e. the sub-entry corresponding to logical block 2 logical page 0) records {SRC_MAP, SRC_PAGE} of {1, 1}, indicating that the user data of {logical block=2, logical page=0} is written to in physical page number 1 of primary block (physical block number 3). The PRI_PAGE field is incremented, and user data is written to {physical block=3, physical page=1} along with recording logical page 0 in the overhead data.

Figure 13:
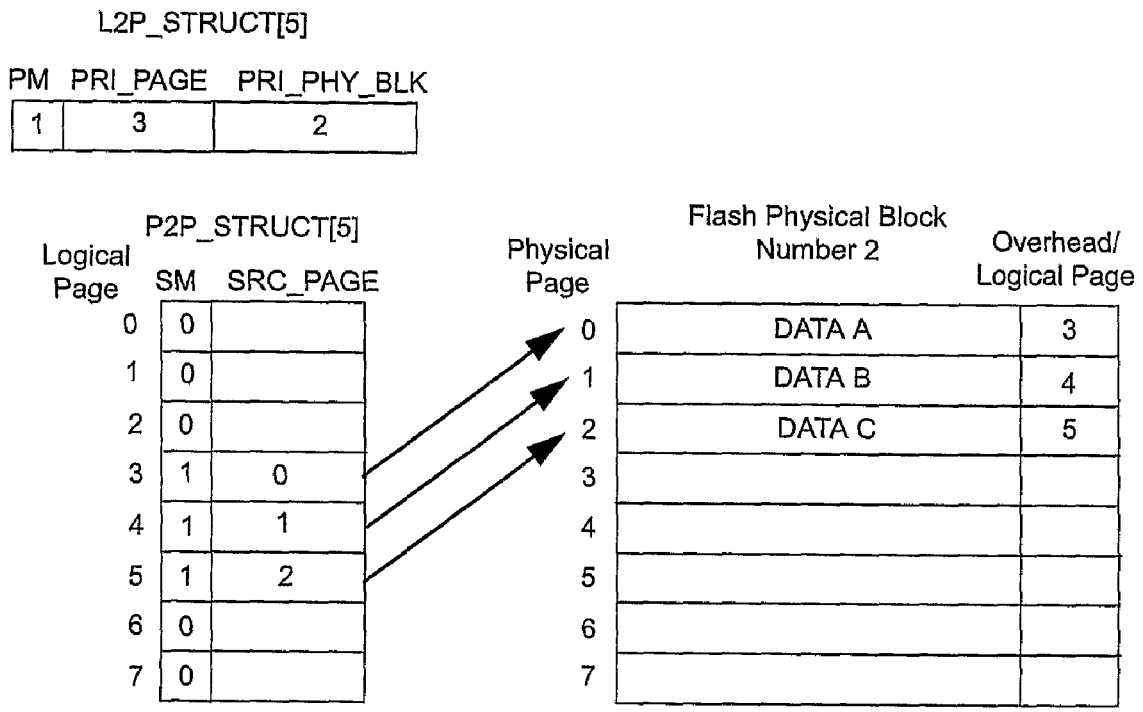
FIG. 13 is another example of writing to logical block 5, logical pages 3-5 using L2P_STRUCT[5] and P2P_STRUCT[5].
Figure 14:
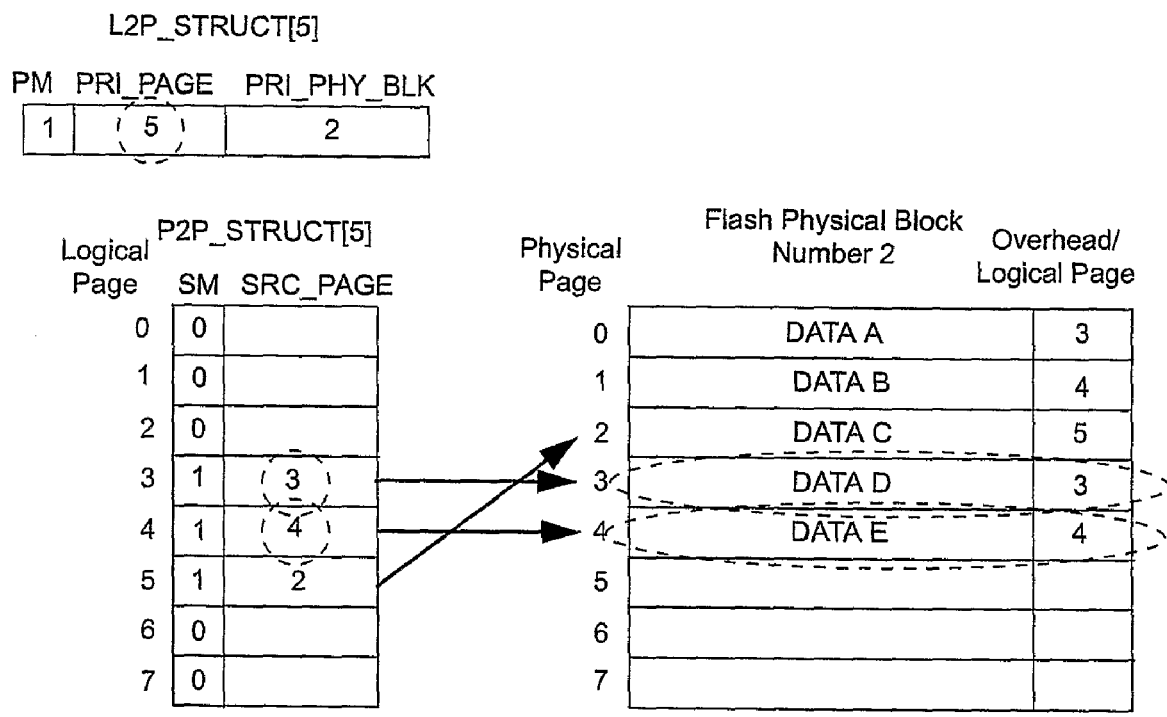
FIG. 14 follows FIG. 13 by rewriting logical block 5, logical page 3-4 using L2P_STRUCT[5] and P2P_STRUCT[5].

FIGS. 13 and 14 explain updating logical pages. FIG. 13 shows an initial state of logical block 5 after 3 pages of user data have been written to it. L2P_STRUCT[5] shows that logical block 5 is mapped to primary physical block 2 (PRI_PHY_BLK=2). Logical pages 3-5 have been written to physical pages 0-2 respectively. The PRI_PAGE field has been incremented to 3 to point to the next available physical page to be written.

FIG. 14 explains what happens when logical pages 3-4 of the same logical block 5 are updated. P2P_STRUCT[5] sub-entries 3 and 4 are overwritten with the new destination physical page numbers, which are physical pages 3 and 4. The PRI_PAGE field has been incremented twice as from 3 to 4, and then from 4 to 5 when physical pages 3 and 4 of physical block 2 are written. User data of {logical block=5, logical page=3} is written to {physical block=2, physical page=3} along with recording the logical page number 3 in the overhead data. Similarly, user data of {logical block=5, logical page=4} is written to {physical block=2, physical page=4} along with recording the logical page number 4 in the overhead data.

This example shows that the P2P_TABLE 106 provides the most up-to-date information about where a logical page has been written (along with respective information in the L2P_TABLE 100 and SA_TABLE 102). In particular, when a logical page has been updated multiple times, the associated sub-entry in the P2P_TABLE 106 contains the most up-to-date information such that the most recently written page, which contains valid data, can be identified, while older pages are effectively superseded. For example, FIG. 14 shows P2P_STRUCT[5][3] of {logical block=5, logical page=3} has a SRC_MAP value of 1 and a SRC_PAGE value of 3. This indicates that valid user data for {logical block=5, logical page=3} is located in physical page 3 of associated primary physical block (since SRC_MAP=1), which is physical block 2 according to associated L2P_STRUCT[5]. The previously written data of the same logical address in physical page 0 is effectively superseded.

The method above does not require updating status or flags in the overhead data of physical pages 0 and 1 whose user data have been superseded. This avoids the additional operational steps and the undesirable effects of potentially affecting state of adjacent memory cells that had been previously written in some types of flash memories.

If power is turned off, the information in P2P_STRUCT[5] is lost, unless it is stored in non-volatile RAM. In the case where the information in P2P_STRUCT[5] is lost on power-off, the valid user page is identifiable from the overhead data field and by the order in which pages are written within a physical block. Among the pages having common logical address recorded in their overhead data, the one valid user page is the one that is most recently written. In FIG. 14, the valid user page for {logical block=5, logical page=3} is {physical block=2, physical page 3}, and this page supersedes physical page 0 which has the same logical page number recorded in its overhead data, since physical page 3 is most recently written compared to physical page 0. A more detailed explanation is provided in the flow charts of FIGS. 26a, 26b and 26c.

It should thus be appreciated that the step of updating the P2P_STRUCT 160 may be omitted during the write process in one variation of the embodiment, since prior to reading any logical page of the logical block, the valid physical page is identifiable from the LPN 82 field in overhead data 72 and by the order in which pages are written within a physical block, such that older pages having a common logical page number is superseded. However, this process will incur higher latency for reads and hence is less desirable.

The example also shows that physical pages of the mapped physical block are all utilized for page writes, regardless of whether the write is to a new or previously written logical address. This results in better efficiency in block usage and less copy operations, resulting in improved performance.

Figure 15:
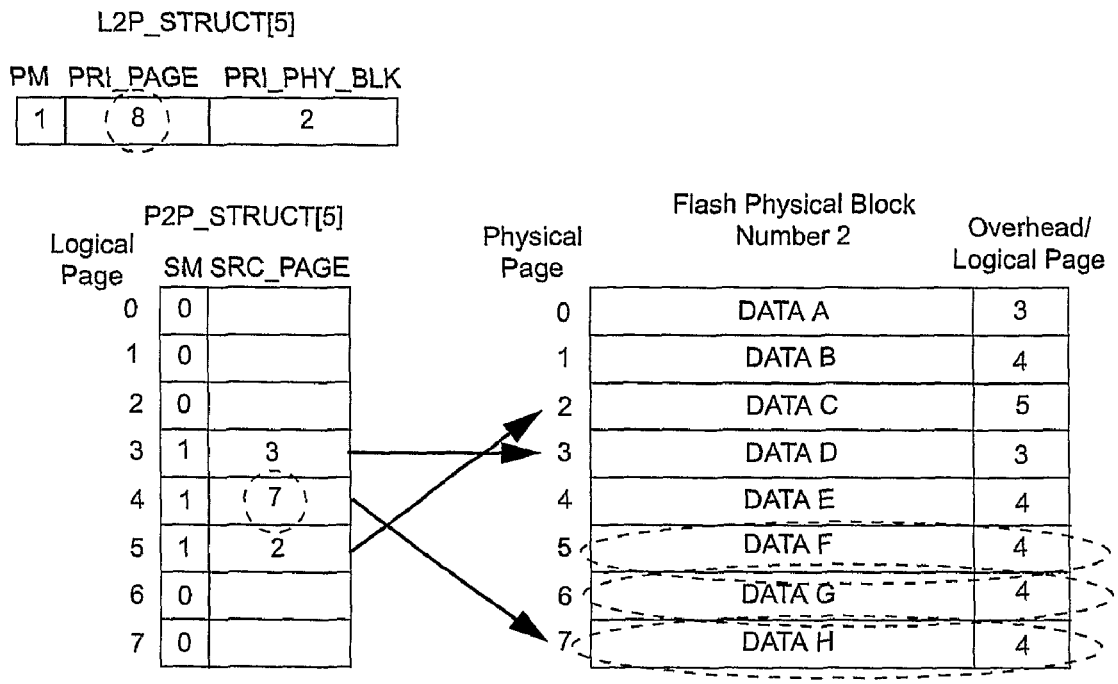
FIG. 15 is the example of rewriting logical block 5, logical page 4 three times using L2P_STRUCT[5] and P2P_STRUCT[5].

FIG. 15 gives an example where logical page 4 of the same logical block 5 has been updated multiple times (e.g., three times). In this example, sub-entry P2P_STRUCT[5][4] has been updated three times from 4 to 5, from 5 to 6, and lastly from 6 to 7. The PRI_PAGE field has been incremented from 5 to 6, from 6 to 7 and lastly from 7 to 8. In this case, the PRI_PAGE field has rolled over, since a block has 8 pages numbered from 0 to 7. User data in physical pages 1, 4, 5 and 6 of physical block 2 are effectively superseded by user data in physical page 7 of the same physical block.

Figure 16:
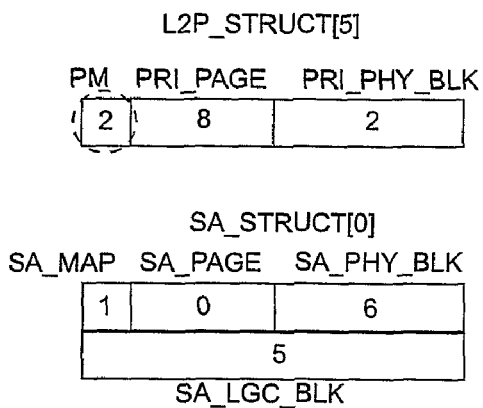
FIG. 16 shows how both physical block 2 and 6 are allocated to logical block 5 in a controller using L2P_STRUCT [5] and SA_STRUCT[0].

According to an embodiment of the present invention, a secondary physical block can be assigned to and be associated with a logical block. The allocation of a secondary block to logical block 5 is explained using example in FIG. 16. Continuing from FIG. 15, all the physical pages of the primary block have been used up, as indicated by PRI_PAGE roll over condition (PRI_PAGE=8). To provide additional physical pages for storing user data, the controller allocates a secondary physical block to the logical block as shown in FIG. 16. This effectively doubles the number of physical pages that are used for page writes to this logical block, with the effect that it delays and reduces page copy operations required to move valid pages from fully programmed blocks to new erased blocks, thereby further increasing the performance of the system.

In FIG. 16, the PRI_MAP tag of L2P_STRUCT[5] is updated from 1 to 2 (PRI_MAP=2) to indicate that a secondary block is assigned to this logical block so that the next page of logical block 5 is written to a secondary physical block. An unused SA_STRUCT structure is assigned to this logical block 5. The SA_STRUCT is tagged with SA_MAP=1 indicating that this SA_STRUCT is being used, SA_PHY_BLK=6 indicating that physical block 6 is assigned as the secondary block, and SA_LGC_BLK=5 indicates that it is associated with logical block 5.

Since there is a limited pool of SA_STRUCTs available, only a limited number of logical blocks can have secondary blocks associated with them. The controller can assign any unused SA_STRUCT (which is tagged with SA_MAP=0) to a logical block. If all SA_STRUCTs are depleted, they have to be reclaimed by performing a logical copy operation described later.

Figure 17:
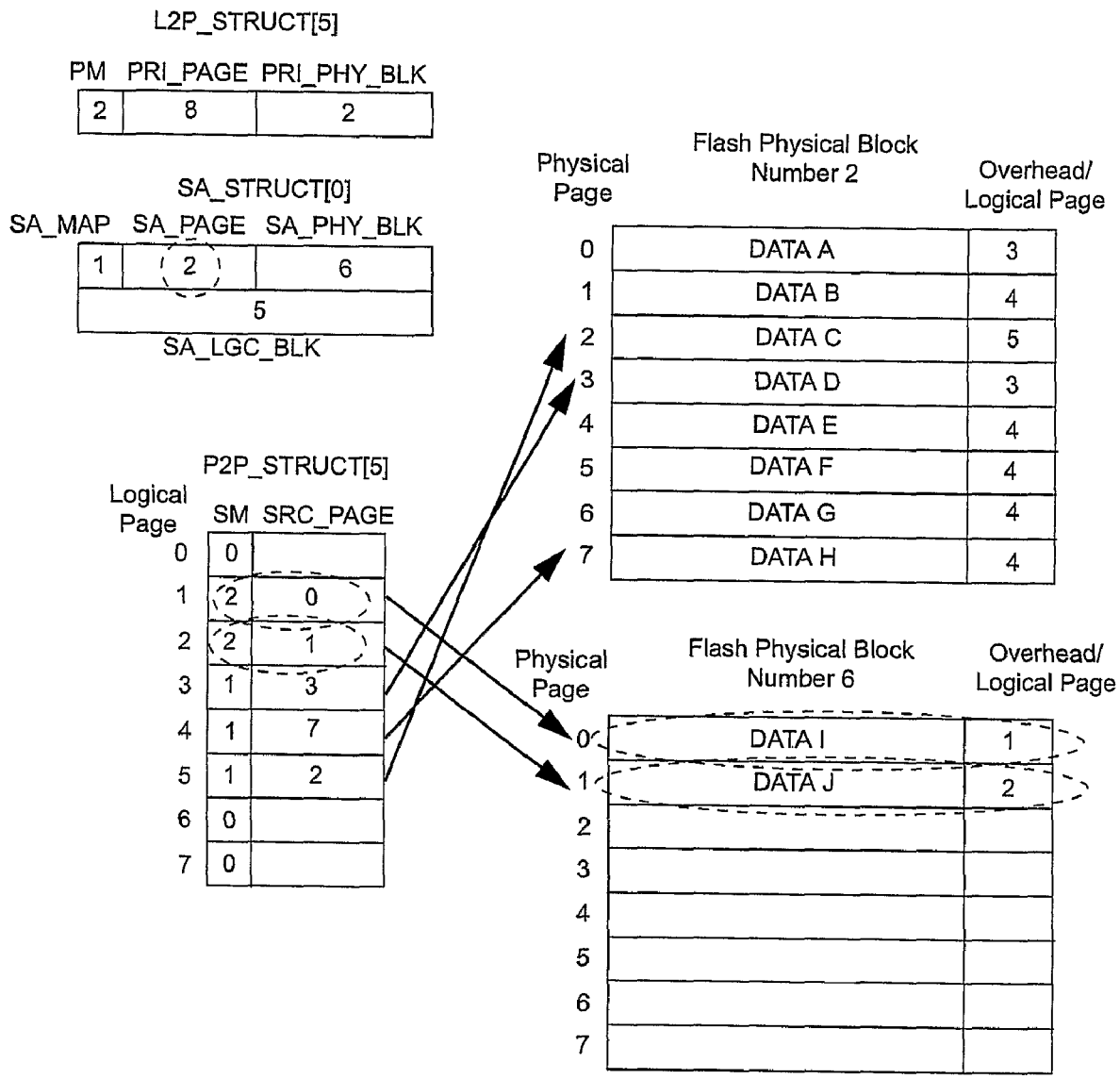
FIG. 17 is the example of writing to logical block 5, pages 1-2 with two physical blocks (2 and 6).

Continuing, FIG. 17 shows an example where logical pages 1 and 2 of logical block 5 are subsequently written. The controller will first read L2P_STRUCT[5], and since the field PRI_MAP=2 and the corresponding PRI_PAGE pointer has rolled over (reaching its maximum value of 8), it indicates the write destination is to a page of the secondary block, the controller will also read the one associated SA_STRUCT having its SA_LGC_BLK field matching the logical block number 5, which is SA_STRUCT[0] in this example. The SA_STRUCT indicates that the next page to write is {physical block=6, physical page=0}. Here, both physical blocks 2 and 6 are mapped to logical block 5.

P2P_STRUCT[5] is then updated as shown in FIG. 17. The sub-entry P2P_STRUCT[5][1] associated with logical page 1 is updated with {SRC_MAP, SRC_PAGE} of {2, 0}, indicating that {logical block=5, logical page=1} is mapped to physical page 0 of secondary physical block (since SRC_MAP=2), which is physical block 6. The sub-entry P2P_STRUCT[5][2] associated with logical page 2 is updated with {SRC_MAP, SRC_PAGE} of {2, 1}, indicating that {logical block=5, logical page=2} is mapped to physical page 1 of secondary physical block (since SRC_MAP=2), which is physical block 6. The SA_PAGE field of SA_STRUCT[0] has been incremented twice, from 0 to 1, and then from 1 to 2, corresponding to two pages being written. User data is written to the respective physical pages along with recording their associated logical page addresses in the overhead data.

Figure 18:
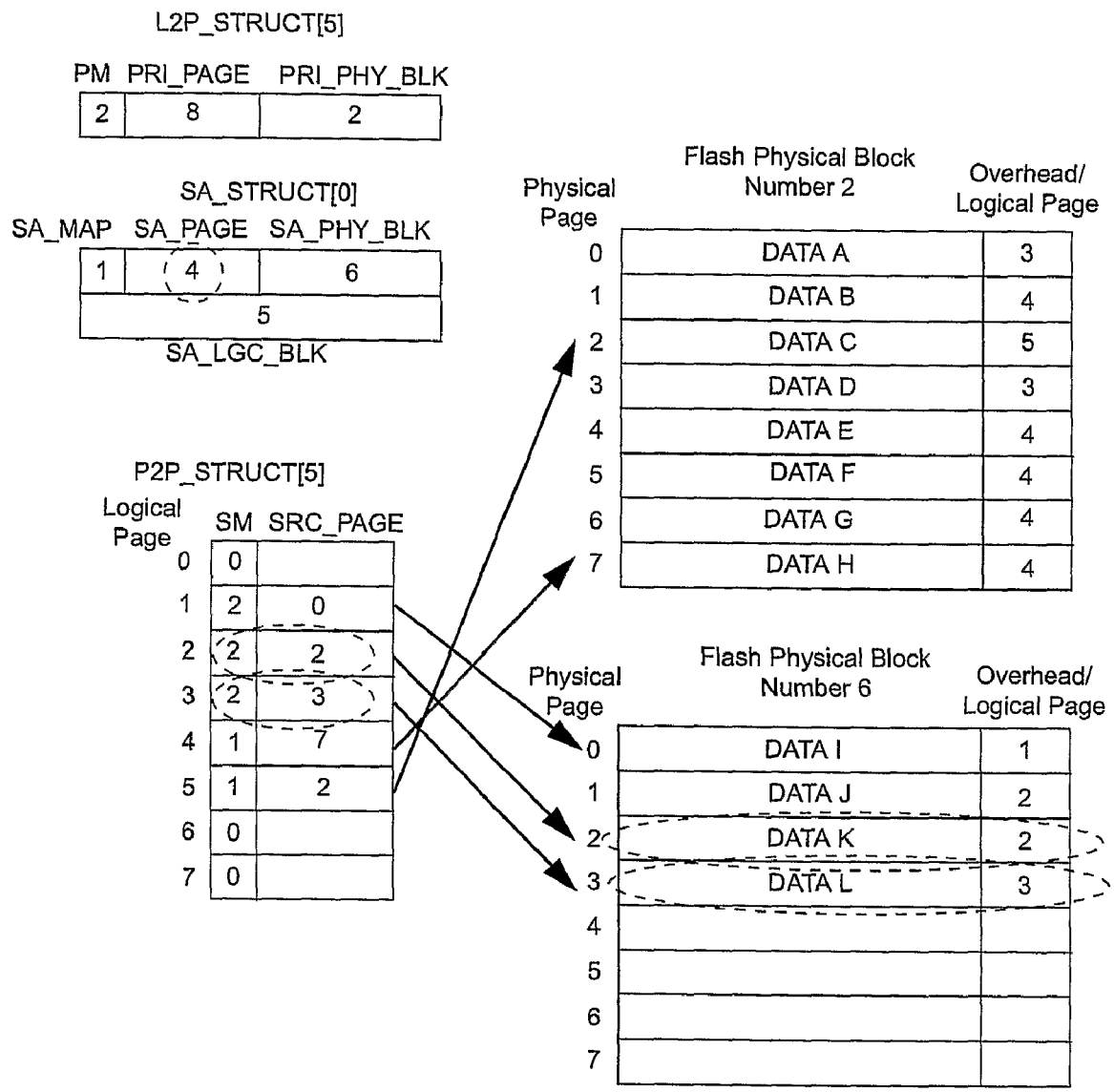
FIG. 18 is a similar example of further writing to logical block 5, pages 2-3 with two physical blocks (2 and 6).

Continuing, FIG. 18 shows an example where logical pages 2 and 3 of logical block 5 are subsequently written. The sub-entry P2P_STRUCT[5][2] associated with logical page 2 is updated with {SRC_MAP, SRC_PAGE} of {2, 2}, indicating that {logical block=5, logical page=2} is mapped to physical page 2 of secondary physical block (since SRC_MAP=2), which is physical block 6. The sub-entry P2P_STRUCT[5][3] associated with logical page 3 is updated with {SRC_MAP, SRC_PAGE} of {2, 3}, indicating that {logical block=5, logical page=3} is mapped to {physical block=6, physical page=3}. The SA_PAGE field of SA_STRUCT[0] has been incremented twice, from 2 to 3, and then from 3 to 4, corresponding to two pages being written. User data is written to the respective physical pages along with recording their associated logical page addresses in the overhead data.

Figure 19:
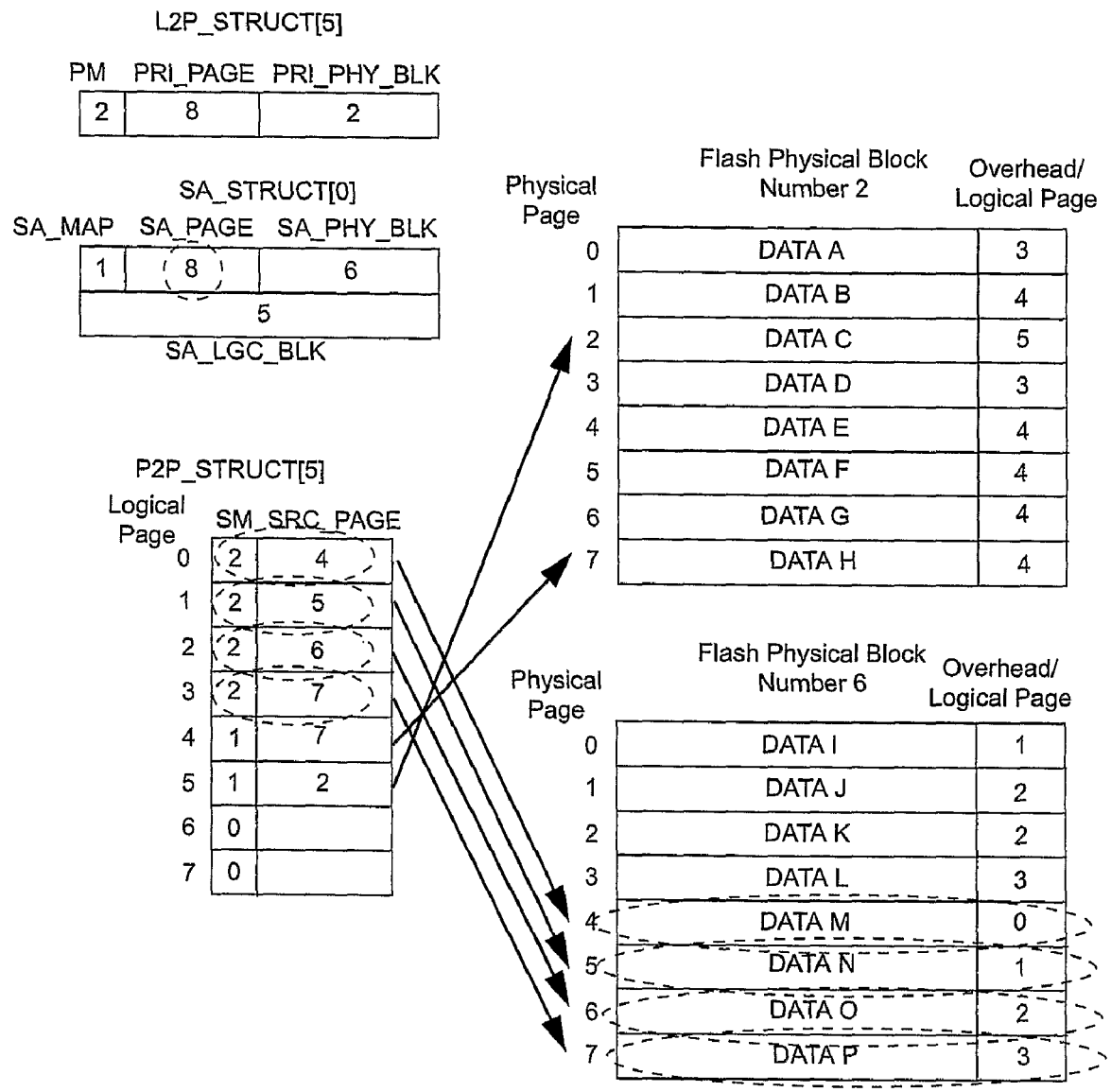
FIG. 19 is the example of updating new data to logical block 5, logical pages 0-3.

Continuing, FIG. 19 shows another example where logical pages 0-3 of logical block 5 are subsequently written. The respective fields of tables L2P_STRUCT[5], SA_STRUCT [0], P2P_STRUCT[5] are updated. In particular, the SA_PAGE field has been incremented four times from 4 to 5, from 5 to 6, from 6 to 7 and finally from 7 to 8, which indicates a roll over condition. User data along with the associated logical page addresses are written to the respective physical pages.

It can be observed in FIG. 19 that in general for a logical block, some logical pages may be mapped to pages in primary physical block (sub-entries having SRC_MAP=1), some logical pages may be mapped to pages in secondary physical block (sub-entries having SRC_MAP=2), and some logical pages may not have been written (sub-entries having SRC_MAP=0).

At some point, a logical block may have used all the pages of its associated primary and secondary physical blocks, as shown in FIG. 19. The valid logical pages must then be copied to a new erased physical block, which will have erased pages that can be used for writing user data. We call this process "logical copy operation". All the valid logical pages can be found in the fields of SRC_MAP 170 and SRC_PAGE 172 of a P2P_STRUCT 160. Logical copy operations may be performed even when not all the physical pages of mapped physical blocks have been written.

After logical copy operation, the original primary and secondary physical blocks will then be marked for erase. This is done by updating the PB_STAT 180 field of these physical blocks to OLD 196 status. In addition, the BSTAT 80 field in the corresponding flash memory block may optionally be updated with the same status.

Figure 20A:
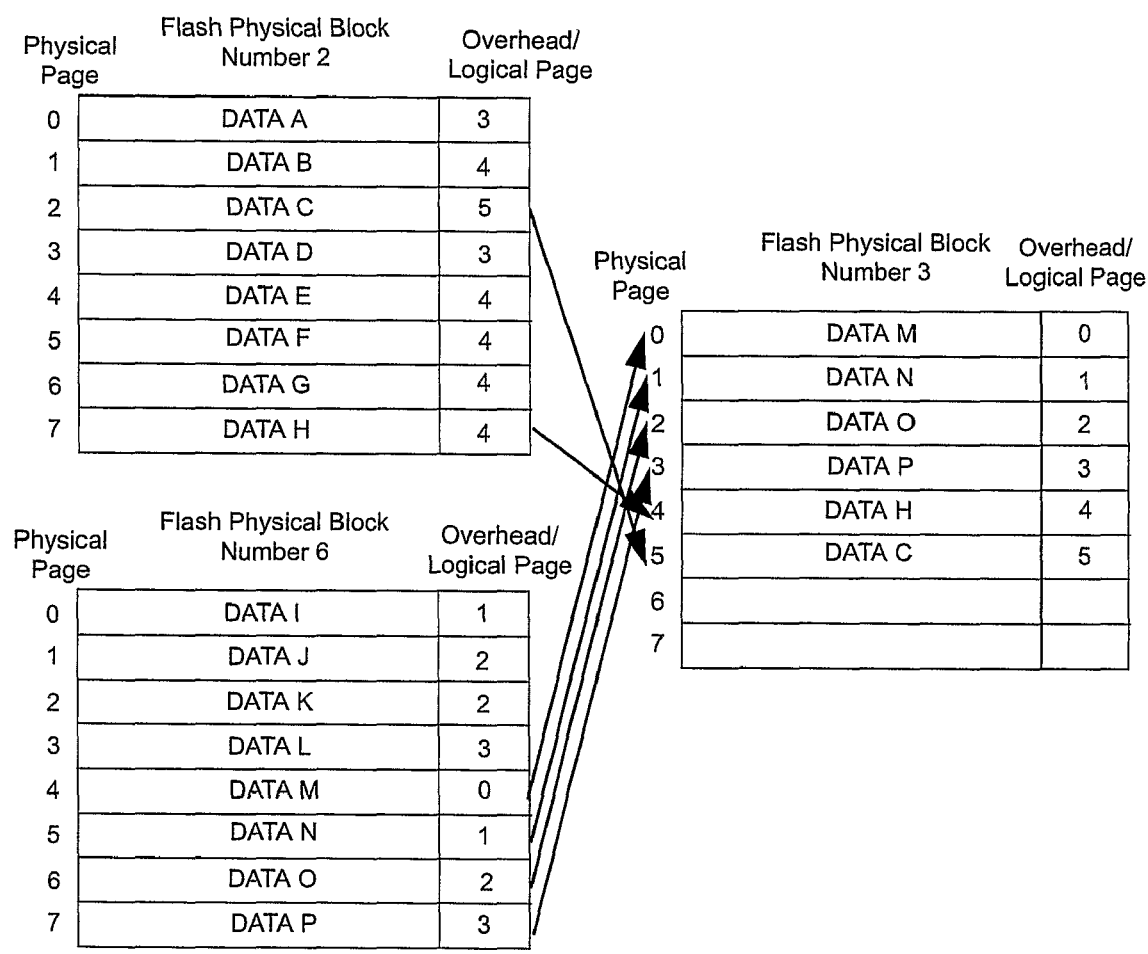
FIG. 20a is the example of logical copy of all valid pages of logical block 5.

Using examples in FIG. 19 and FIG. 20*a*, the operation of a logical copy of all valid pages from two mapped physical blocks (2 and 6) to a newly assigned physical block (3) are shown. The controller reads P2P_STRUCT[5] for logical block 5 from sub-entry 0 to 7 to determine if any logical page is valid. If a sub-entry is mapped (SRC_MAP is not 0 in P2P_STRUCT[5]), it determines the physical block (primary block if SRC_MAP=1 or secondary block if SRC_MAP=2) and physical page (SRC_PAGE) it is mapped to. It copies the user data from the current {physical block, physical page} to a new {physical block, physical page} and records the new mapping information. If an entry of the original physical page is not mapped (e.g. logical page 6), it skips the copy operation for that page.

For example, as shown in FIGS. 19 and 20*a*, {logical block=5, logical page=0} is currently mapped to {physical block=6, physical page=4}. User data at that physical page is copied to {physical block=3, physical page=0} and recording logical page 0 in its overhead area.

The user data of flash memory page {physical block=6, physical page=4} is typically read out to a holding register internal to the flash memory cell. Next, the user data held in the holding register is then programmed into the flash memory page at {physical block=3, physical page=0}. Alternatively, the user data can be read out into a buffer in the controller, and then the data in the buffer is programmed into the flash memory page at {physical block=3, physical page=0}.

Figure 20B:
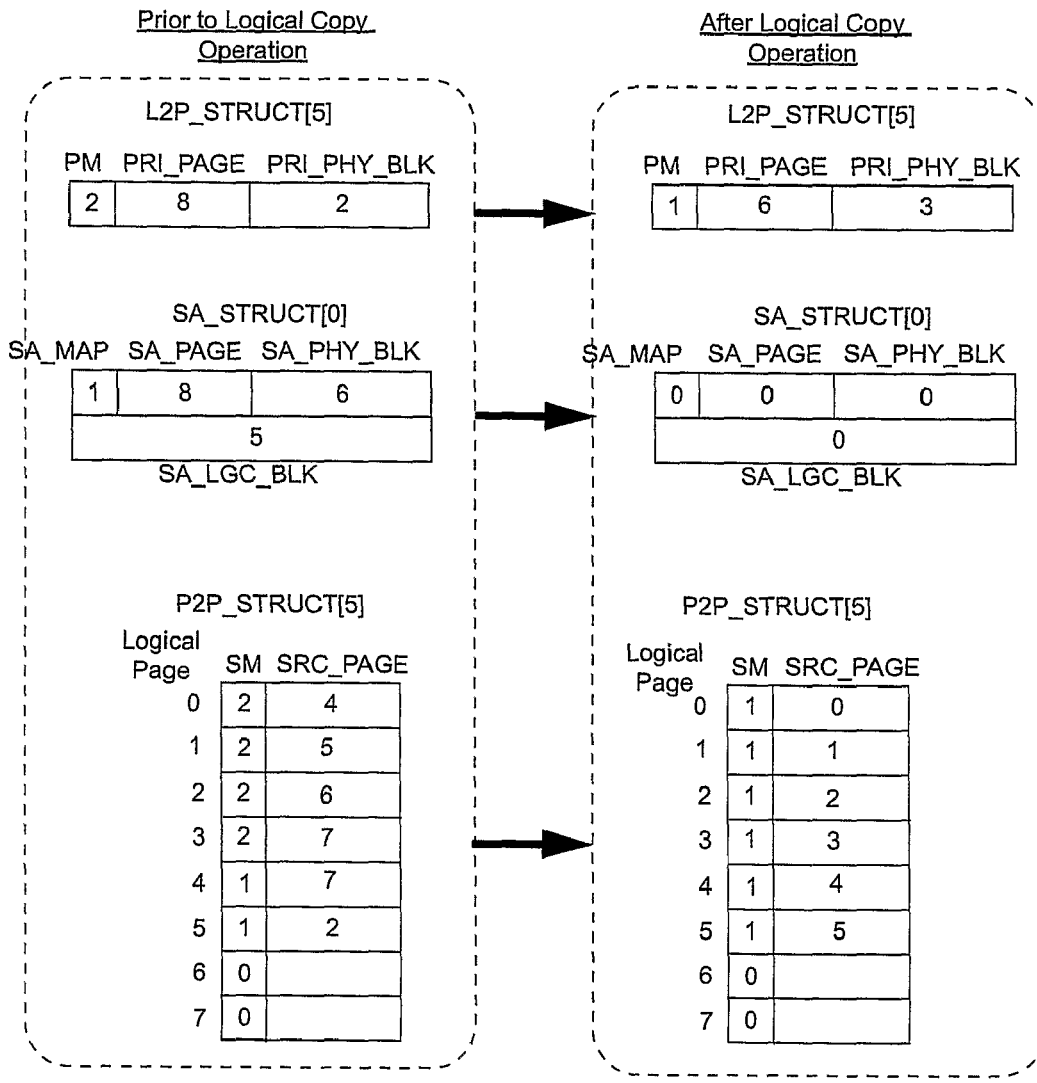
FIG. 20b is the system structures after logical copy of all valid pages.

FIG. 20*b* shows the system structures before and after the logical copy operations. Note that after this, the logical block only uses one physical block (e.g., 3), as opposed to two (e.g., 2 and 6). In addition, the SA_STRUCT is now free and unused. The next physical page to write is given by the field PRI_PAGE in L2P_STRUCT which is 6. After this logical copy operation, physical blocks 2 and 6 are marked for erase, i.e. PB_STAT[2] and PB_STAT[6] are both changed from USE 195 to OLD 196.

Block erase may be performed in the background during times when the controller is idle. In this process, controller reads entries of PB_TABLE 104 and erases any physical block whose PB_STAT 180 is marked OLD 196. After erase operation is completed, the corresponding PB_STAT 180 is changed to FREE 194. The erased block can then be reused and be allocated to any logical block.

There are alternative variations of logical copy operations. One method is for the controller to copy only pages belonging to the secondary block to a new physical block, while pages belonging to the primary physical block remain unchanged. This may be performed if the total number of valid secondary pages is small. The valid secondary pages are copied to a new secondary physical block, and the mapping structures, in particular, the associated SA_STRUCT, is modified accordingly after the logical copy operation. The advantage of this scheme over the above mentioned scheme (copying all valid pages) is that time spent on copy operation is reduced when the number of valid secondary pages is small, resulting in higher system performance in certain host access patterns.

Figure 21A:
FIG. 21a is the example of logical copy of all valid secondary pages of logical block 5.
Figure 21B:
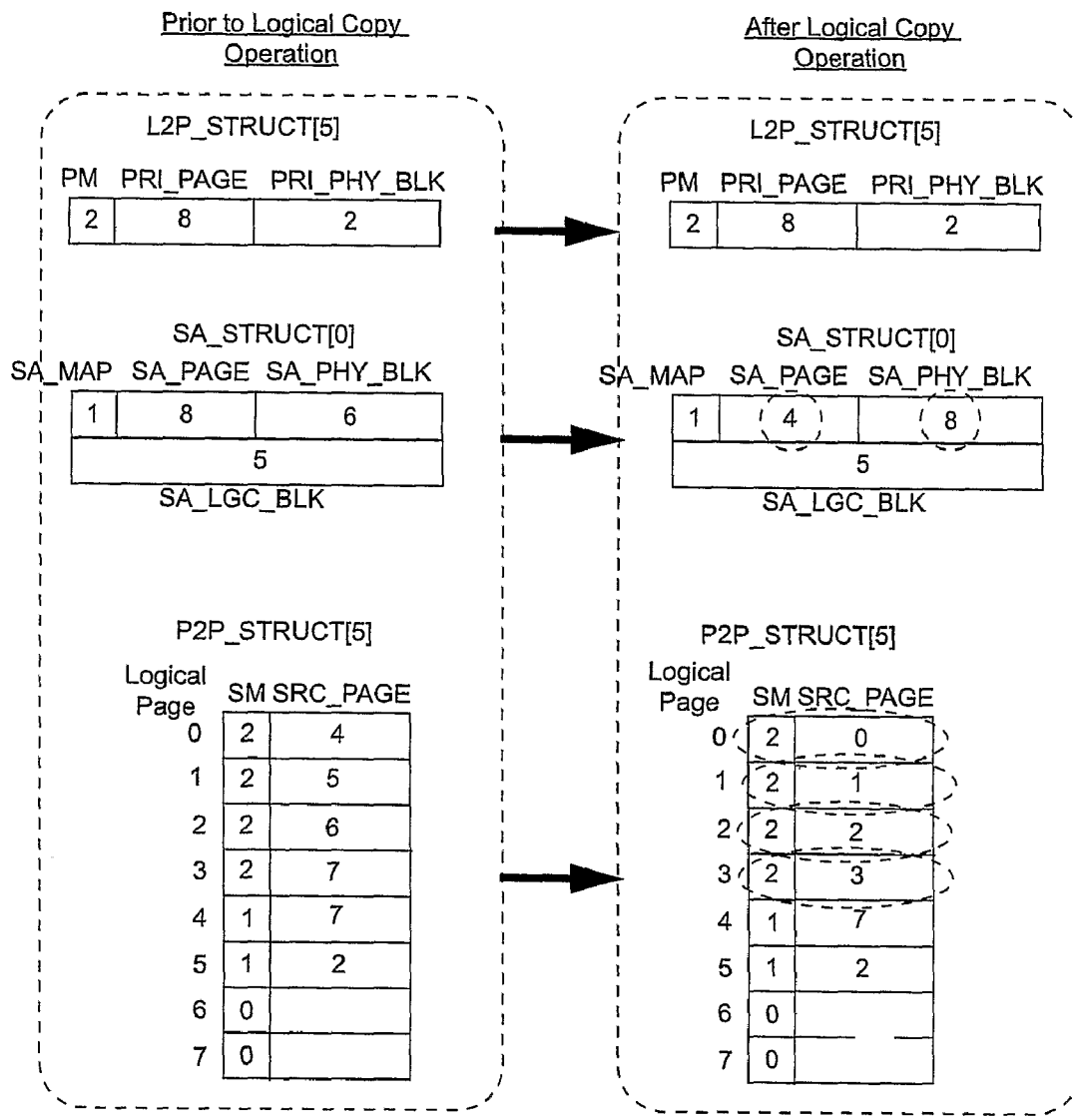
FIG. 21b is the system structures after logical copy of all secondary pages of logical block 5.

An example is shown in FIG. 21*a*, where the newly allocated secondary block is 8. The system structure before and after copy operation is as shown in FIG. 21*b*. Note that there is no change to the L2P_STRUCT as indicated by the same entries in fields PM, PRI_PAGE & PRI_PHY_BLK. The next physical page to be written is given by SA_PAGE which is {physical block=8, physical page=4}.

Physical block 6 is then marked for erase after the copy operation. After logical copy of secondary pages, the logical block is still associated with two physical blocks indicated by PRI_MAP=2.

While it has been shown in the examples that logical copy operation is performed when all the pages of the primary and secondary block have been written, the controller may perform such operations even when not all the pages of the primary and secondary block have been written. The controller may perform logical copy operations ahead of time in anticipation of future write patterns, or in the background during times when the controller is not busy.

To achieve higher performance, the host commonly writes or reads multiple pages per command. In this respect, there are a number of specific conditions to be illustrated in addition to the above examples. For example, consider a logical block having been allocated a primary block only, some of its pages having been written, and some of its pages being free, and suppose the number of free pages is less than the number of pages of user data requested to be written by one host command. In this situation, the controller will first write user data to the remaining free pages in the primary block, allocate a secondary block, and write subsequent user data to the pages in the secondary block. In this specific condition where a host command requesting writing a plurality of pages of user data, at least a portion of the pages of user data will be written to the primary physical block, and the remaining pages of user data of the same host command will be written to the secondary physical block. In effect, the plurality of user data associated with one host command may be at least partially written to primary physical block, and at least partially written to the secondary physical block.

In another specific condition, consider a logical block having been allocated a primary block and a secondary block, the pages of the primary block being fully written, some of the pages of the secondary block having been written and some of the pages being free to be written. Suppose that the number of free pages of this secondary block is less than the number of pages of user data requested to be written by one host command. In this situation, the controller will first write at least a portion of the user data of the host command to the remaining free pages in the secondary block, perform a logical copy operation, and write the remaining pages of user data of the same host command to the pages in the new block. Alternatively, the controller may perform logical copy operation to move all valid pages to a new primary physical block, next write at least a portion of the user data of the host command to the primary physical block, then allocate a secondary block, and then write the remaining pages of user data of the same host command to pages in the secondary block.

More generally, a host write (or read) command requesting multiple pages is effectively divided into individual page operations by the controller, and if it reaches a specific boundary, the controller will perform the appropriate primary or secondary block allocation or logical copy operation.

Logical-to-physical mapping data are stored in portions of NVRAM 23 and portions of the overhead data 72 of flash memory. On power off, all the mapping data stored in NVRAM 23, including the L2P_TABLE 100, SA_TABLE 102 and PB_TABLE 104, are retained. In particular, for a logical block mapped to a physical block, the page pointer data indicating the next free physical page of the physical block is retained between power-off and on, without having the controller to 'rediscover' from flash memory where the next free page is on power-on. Likewise, if a logical block is mapped to two physical blocks, the associated SA_STRUCT 140 mapping structure is retained and allows the controller to identify the secondary physical blocks on power-on.

Figure 22:
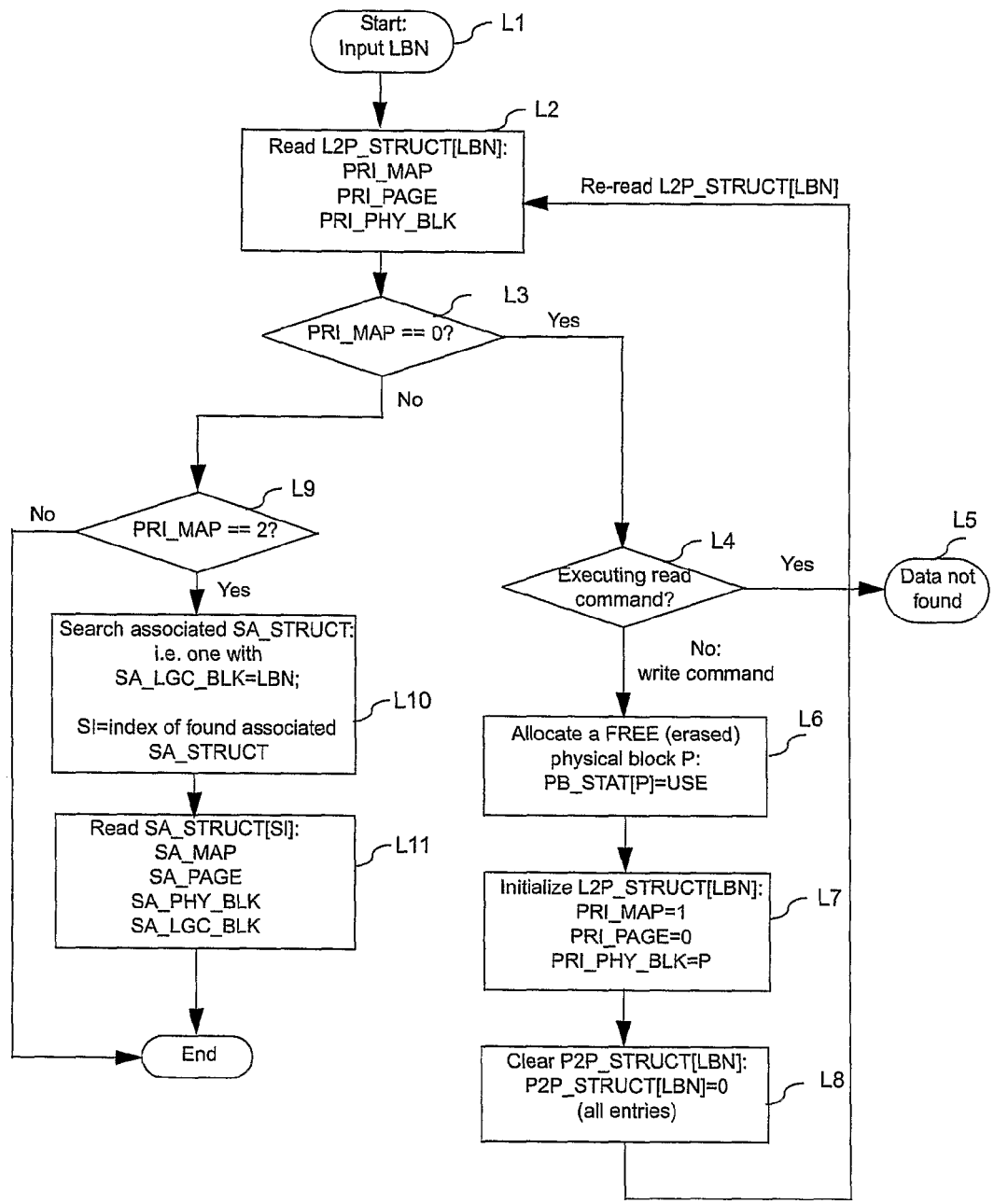
FIG. 22 is the process flow chart for reading the current mapping state for logical block LBN.

FIG. 22 shows a flow chart describing the procedure on how the controller reads the contents of the NVRAM 23 to obtain the current mapping state of a logical block. On receiving a read or write command from the host, the controller translates the logical address received to a logical block address LBN at step L1. Next the controller reads the L2P_STRUCT[LBN] addressed by LBN at step L2. The controller checks the PRI_MAP field at step L3. If PRI_MAP is 0, it indicates that the logical block is not mapped. If the controller is processing a read command, this indicates that no data is found, as shown in steps L4 and L5. If on the other hand, the controller is processing a write command, the controller must allocate an erased physical block to the logical block, as shown in step L6. The allocated erased physical block P is marked with status USE 195 (PB_STAT[P]=USE). At step L7, the L2P_STRUCT[LBN] is initialized with PRI_MAP=1 indicating that the logical block is mapped to a primary physical block, PRI_PHY_BLK is initialized to the allocated erased physical block P, which is called the primary physical block, and PRI_PAGE is initialized to 0. Next at step L8, all sub-entries of P2P_STRUCT[LBN] are initialized to 0 indicating that none of the logical pages are mapped to any physical page. Next, step L2 is repeated to re-read the L2P_STRUCT[LBN]. As the logical block LBN has just been mapped, step L3 will have a non-zero PRI_MAP.

At step L3, if PRI_MAP is non-zero, the controller checks the value of the PRI_MAP field. If it is not 2, then the procedure for obtaining the current mapping state of a logical block is done. If PRI_MAP is 2, then the logical block has an associated secondary block. At step L10, the controller searches for the one entry in the SA_TABLE that is associated with logical block LBN. The controller does this by checking the entries in the SA_TABLE until the one having value of SA_LGC_BLK field matching LBN is found. This is the entry that is associated with logical block LBN. In this case, an internal parameter SI records the index of SA_TABLE of found entry. At step L11, the controller reads the rest of the fields of the found entry, which are SA_MAP, SA_PAGE, SA_PHY_BLK and SA_LGC_BLK.

At the end of this procedure, the controller has obtained the current mapping state of logical block LBN, which consists of the fields PRI_MAP, PRI_PAGE, PRI_PHY_BLK, SI, SA_MAP, SA_PAGE, SA_PHY_BLK and SA_LGC_BLK. The controller can then proceed with performing logical page writes and reads to this logical block.

There may be times when a host command specifies a starting logical address and a (consecutively addressed) plurality of pages of data that crosses logical block boundary. As an example, if a logical block is 128 KB containing 64 logical pages of 2 KB each, then a host write command specifying a starting address of 126 KB and 4 pages of user data will cross block boundary. In this situation, the controller breaks the host command into sub-commands, such that each sub-command is naturally aligned to logical block address boundary. In this example, the first sub-command will have a starting address of 126 KB with the first page of user data, and the second sub-command will have a starting address of 128 KB with the remaining 3 pages of user data. The sub-commands are executed separately one after another. In such a situation, for each sub-command, the procedure as outlined in FIG. 22 is executed followed by one or more page writes or reads.

Figure 23:
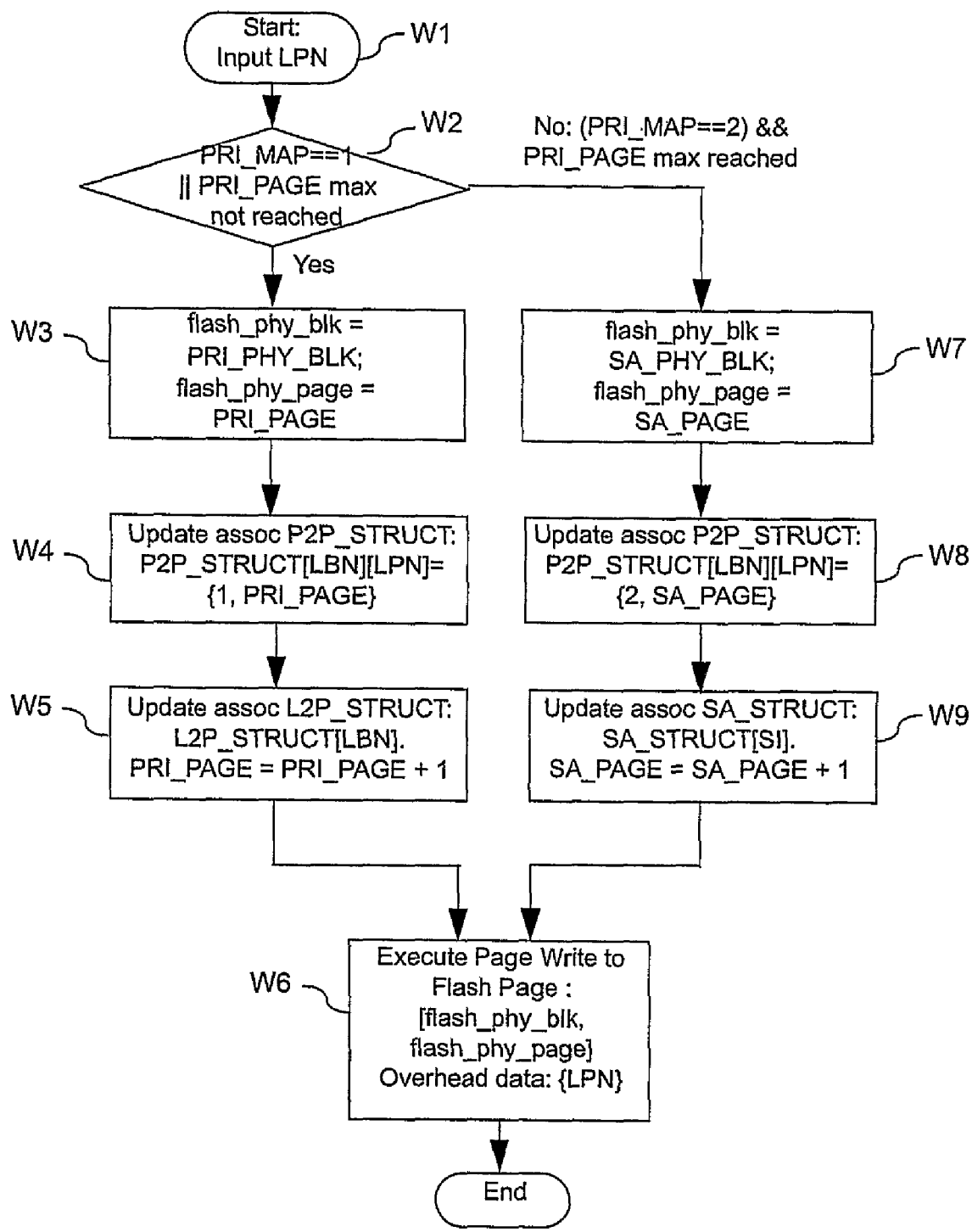
FIG. 23 describes the write operation to logical page LPN of logical block LBN.

FIG. 23 shows a flow chart describing the procedure on how the controller performs writing of logical page LPN. This procedure is only executed after the procedure in FIG. 22 has been executed for the controller to obtain the current mapping state of logical block LBN.

At step W1, the controller obtains a logical page number LPN. Next, the controller checks PRI_MAP at step W2. If PRI_MAP is 1 or the PRI_PAGE pointer has not reached its maximum value (i.e. there are still more free physical pages in the associated primary physical block), user data is to be written to a physical page in the primary physical block PRI_PHY_BLK, as shown in step W3. The physical page is the one pointed to by the primary page pointer PRI_PAGE. At step W4, the controller updates the P2P_STRUCT[LBN][LPN], the sub-entry addressed by the logical block LBN and logical page LPN. The SRC_MAP is marked as 1 indicating that the logical page is mapped to a primary physical block. The SRC_PAGE field is updated to indicate the physical page number of the page to be written. Next, at step W5, the primary page pointer is incremented. At step W6, the physical page ({PRI_PHY_BLK, PRI_PAGE}) is then written with user data, along with the logical page number recorded in the overhead data.

If on the other hand, at step W2, the PRI_MAP is 2 and the PRI_PAGE pointer has reached its maximum value (roll over condition, i.e., no more free physical pages in the associated primary physical block), user data is to be written to a physical page in the secondary physical block SA_PHY_BLK, as shown in W7. The physical page is the one pointed to by the SA_PAGE pointer. At step W8, the controller updates the P2P_STRUCT[LBN][LPN], the sub-entry addressed by the logical block LBN and logical page LPN. The SRC_MAP is marked as 2 indicating that the logical page is mapped to a secondary physical block, and the SRC_PAGE field is updated to indicate the physical page number of the page to be written. Next, at step W9, the secondary page pointer is incremented. At step W6, the physical page ({SA_PHY_BLK, SA_PAGE}) is then written with user data, along with the logical page number recorded in the overhead area.

Figure 26A:
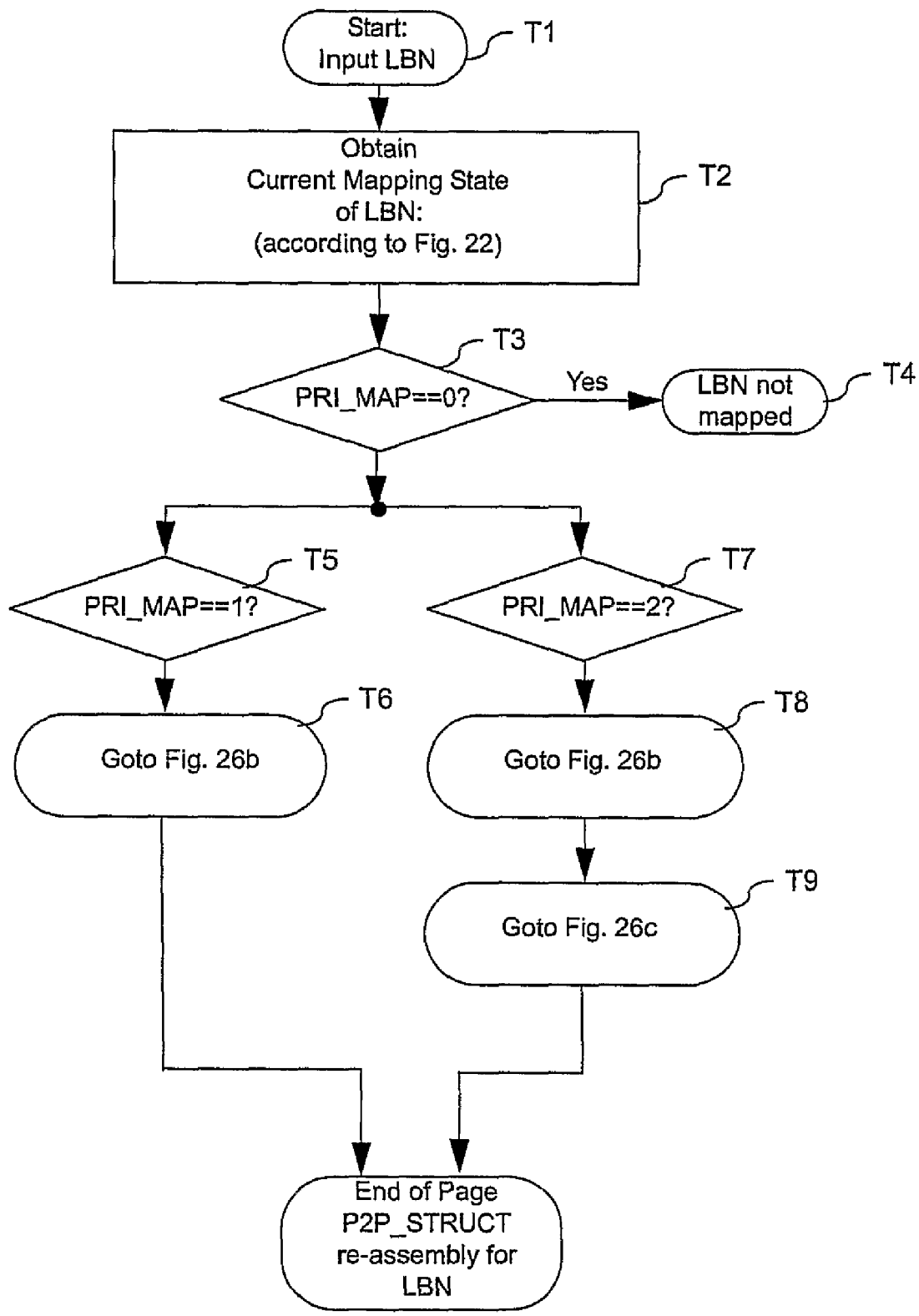
FIGS. 26a, 26b and 26c is a process flow chart for re-constructing logical page to physical page mapping for logical block LBN.
Figure 26B:
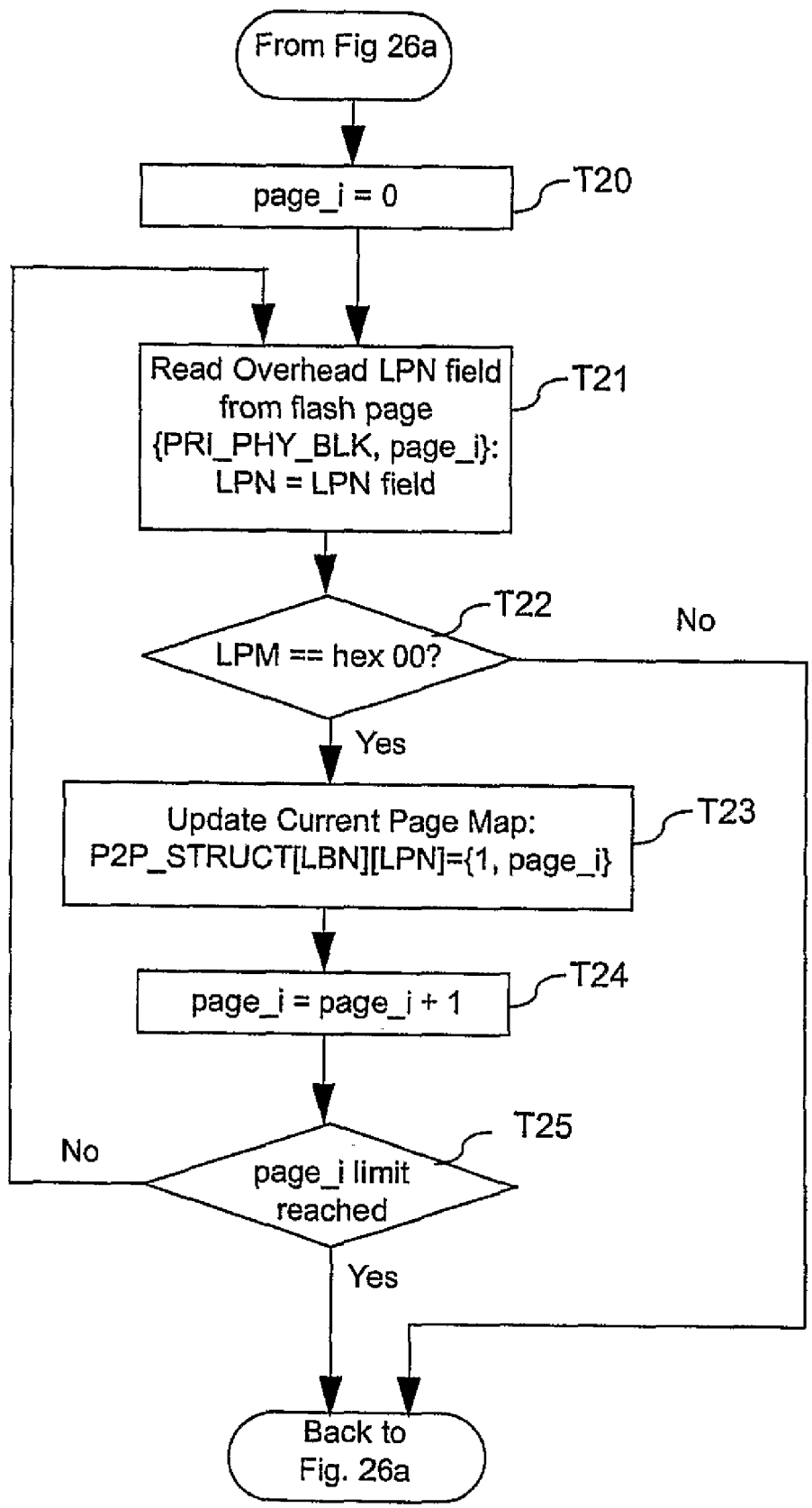
Figure 26C:
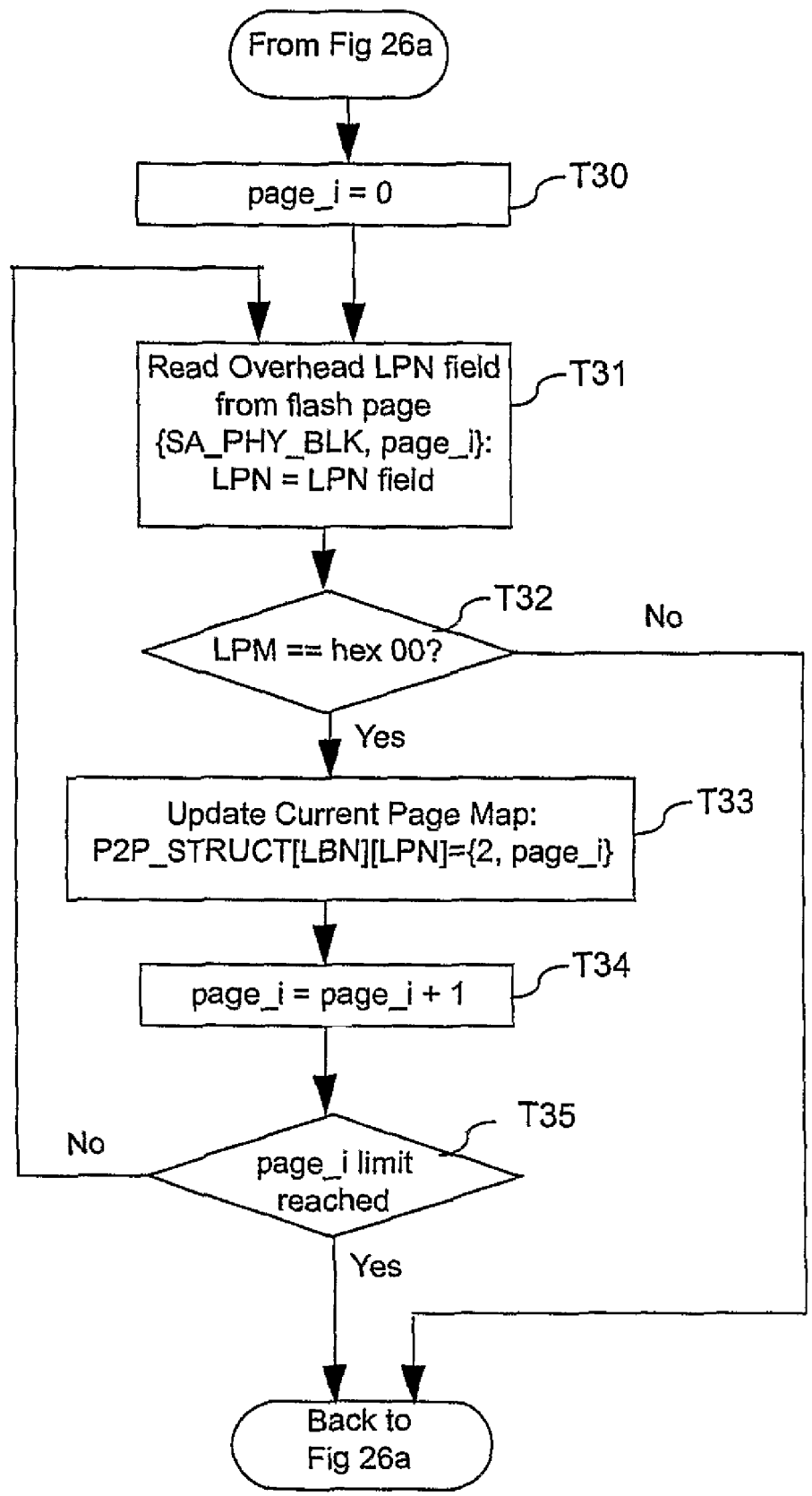

(Strictly speaking, steps W4 and W8 may be omitted, since prior to any subsequent read, any P2P_STRUCT 160 can always be reconstructed from reading the corresponding overhead data, as detailed in FIGS. 26*a*, 26*b* and 26*c*. However, it is highly desirable to have steps W4 and W8, since the process of re-constructing a P2P_STRUCT 160 will represent latency time prior to read.)

Generally, the host desires to read or write to multiple pages per command. In this case, the controller will translate the logical address into multiple logical pages to be read or written. The procedure shown in FIG. 23 applies to writing one logical page. If multiple logical pages belonging to logical block LBN are to be written, the procedure of FIG. 23 is executed separately for each of the logical page.

Figure 24:
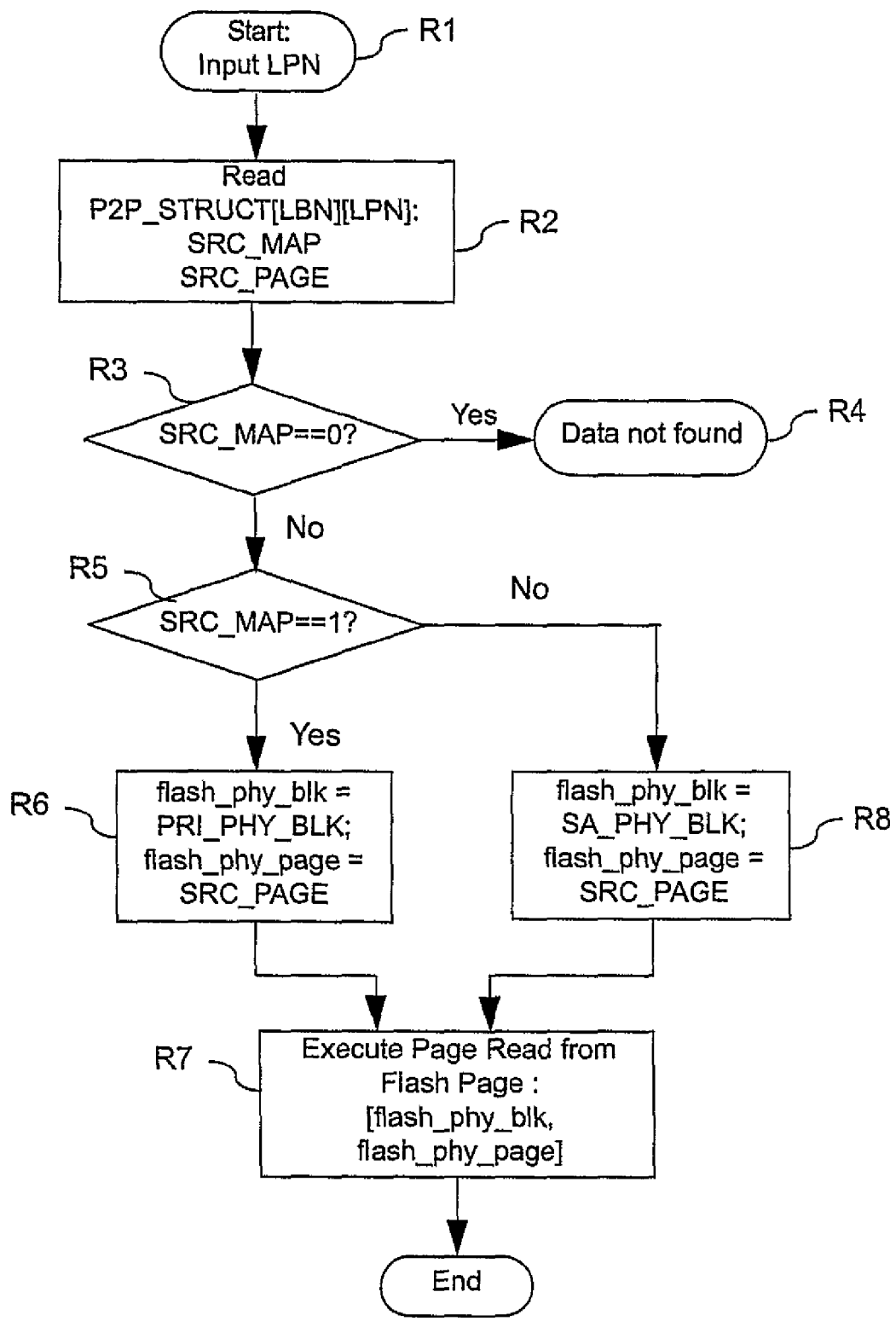
FIG. 24 describe the process of reading logical page LPN of logical block LBN.

FIG. 24 shows a flow chart describing the procedure on how the controller performs reading of logical page LPN. This procedure is only executed after the procedure in FIG. 22 has been executed for the controller to obtain the current mapping state of logical block LBN.

At step R1, the controller obtains a logical page number LPN to be read. Next, the controller reads P2P_STRUCT [LBN][LPN] to obtain the SRC_MAP and SRC_PAGE fields at step R2. The controller checks the SRC_MAP field in step R3. If it is 0, it indicates that the logical page is not mapped and no data is found as shown in step R4. At step R5, if SRC_MAP is 1, then the physical page corresponding to logical page LPN is in the primary physical block. Step R6 shows that the primary physical block is given by PRI_PHY_BLK, and the primary page is as recorded in SRC_PAGE. Next, at step R7, the controller reads the user data from {physical block, physical page} of {PRI_PHY_BLK and SRC_PAGE}. If on the other hand, at step R5, the SRC_MAP is 2, then the physical page corresponding to logical page LPN is in the secondary physical block. Step R8 shows that the secondary physical block is given by SA_PHY_BLK, and the secondary page is as recorded in SRC_PAGE. Next, at step R7, the controller reads the user data from {physical block, physical page} of {SA_PHY_BLK, SRC_PAGE}.

Figure 25:
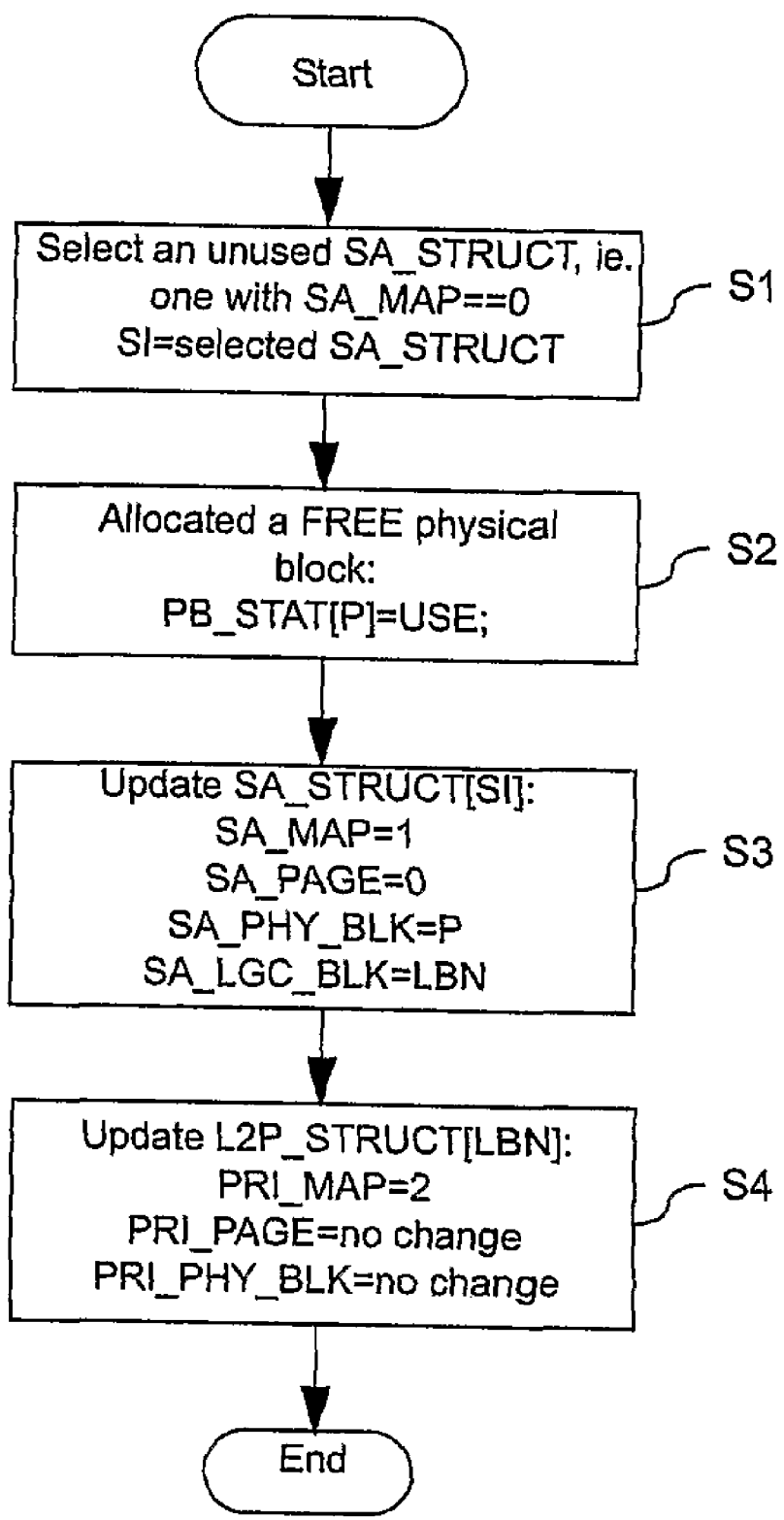
FIG. 25 describes the allocation of secondary block for logical block LBN.

FIG. 25 shows a flow chart describing the procedure for allocation of a secondary block for a logical block LBN. At step S1, the controller selects an unused SA_STRUCT, i.e., one that has SA_MAP=0. At step S2, an erased physical block P is found from a pool of such erased physical blocks, and its corresponding status PB_STAT[P] is marked USE. At step S3, the selected SA_STRUCT is initialized, such that SA_MAP=1, SA_PAGE is initialized to 0, the found erased physical block P is recorded in the SA_PHY_BLK field, and the logical block LBN is recorded in the SA_LGC_BLK field to indicate that this SA_STRUCT is linked to logical block LBN. Finally, the PRI_MAP field of L2P_STRUCT[LBN] is updated to 2 to indicate that the logical block is now mapped to two physical blocks, a primary physical block and a secondary physical block There are alternative means of obtaining new erase physical blocks and marking blocks for erasure apart from using the PB_TABLE 104. Each physical block 50 of flash memory 5 may contain a specific location to indicate its usage status. In this respect, the steps indicated by FIG. 22 L6 and FIG. 25 S2 for allocating physical block can be performed by alternative means. Likewise, marking a block for erasure can be performed by alternative means aside from updating the PB_TABLE 104.

In the present embodiment, the page lookup table P2P_TABLE 106 is stored in volatile RAM whose content is lost on power-off. Prior to read operations of a logical block, its logical page to physical page mapping is known, and if it is lost, can be retrieved from flash memory. Any P2P_STRUCT 160 of a logical block can be re-constructed using the current mapping state of the logical block (from corresponding NVRAM structure), and the order in which pages are written within the primary physical block, or the primary and secondary physical blocks. For a memory system with physical blocks each having N pages, the time order of programming in a logical block is as follows:

If (PRI_MAP=1), the time order of writing pages, from earliest time to latest time, is from physical page 0 to physical page (N−1) of primary physical block PRI_PHY_BLK.

If (PRI_MAP=2), the time order of writing pages, from earliest time to latest time, is from physical page 0 to physical page (N−1) of primary physical block PRI_PHY_BLK, followed by from physical page 0 to physical page (N−1) of secondary physical block SA_PHY_BLK.

Each P2P_STRUCT 160 of a logical block can be reconstructed by doing a forward order reading of the overhead data of physical pages according to the time order of writing. The process is described in FIGS. 26a, 26b and 26c.

Starting at FIG. 26a, at step T1, the controller has translated the logical address received from the host to a logical block LBN. At step T2, the current mapping state of LBN is obtained from the corresponding data structures in NVRAM, as detailed in FIG. 22. However, for this operation, the steps of L4, L5, L6, L7 and L8 are omitted, since allocating a physical block is not required. In other words, at step L3, if PRI_MAP==0, the process flow chart terminates. At step T3, PRI_MAP is checked, and if it is zero, it indicates that the logical block LBN is not mapped as indicated at step T4.

If PRI_MAP equals 1, at step T5, it indicates that the logical block LBN is mapped to one physical block (primary physical block). Next, the steps of FIG. 26b are performed, indicated by step T6. Referring to FIG. 26b, at step T20, variable page_i is initialized to 0 to point to the first programmed page. Next, at step T21, the overhead data of the physical page numbered page_i of the primary physical block (PRI_PHY_BLK) is read. The controller skips reading the user data portion of the page. At step T22, if the page has been written, (LPM==hex 00), sub-entry P2P_STRUCT[LBN][LPN] (corresponding to logical page LPN) is updated with SRC_MAP equals 1 and SRC_PAGE equals the current physical page number, as shown in step T23. At T22, if the page has not written, the process ends, since subsequent pages will also be free due to the sequential order in which pages within a block is selected. At step T24, page_i is incremented to point to the next page. At step T25, page_i is checked to determine if it has reached its limit. If not, the re-assembly process is repeated for the next sequential page and P2P_STRUCT[LBN][LPN] is updated accordingly. If at step T25, page_i has reached its maximum limit, then the re-assembly process ends. The limit is reached when all overhead data of programmed physical pages of PRI_PHY_BLK have been read.

If PRI_MAP is 2, as in step T7, it indicates that the logical block LBN is mapped to two physical blocks, a primary physical block, and a secondary physical block. Continuing, for PRI_MAP equals 2, the re-assembly is performed first for the primary physical block (FIG. 26b), and then followed by FIG. 26c. The steps of FIG. 26c is similar to FIG. 26b, except that the pages of the secondary physical block SA_PHY_BLK is read at step T31 (instead of PRI_PHY_BLK at step T21), and when updating the P2P_STRUCT at step T33, SRC_MAP is marked 2 (instead of 1 at step T23).

At the end of the reconstruction, the P2P_STRUCT contains mapping information that reflects the most up-to-date valid pages that had been written for a logical block LBN.

For a logical block mapped to one or more physical blocks, each physical block having a plurality of physical pages, there may be one or more programmed physical pages of the mapped physical block(s) having a common logical page number LPN 82 (recorded in their overhead data). In effect, the technique of reconstruction of a P2P_STRUCT 160 will allow the controller to identify, among the one or more physical pages having a common LPN 82, the one physical page that contains valid user data, while data in at least one physical page of the physical block mapped to a logical block having a common LPN 82 is effectively superseded.

While only a single embodiment of the invention has been described in detail above, many variations are possible within the scope of the invention, as defined by the appended claims. Two alternative embodiments of the invention will now be described, by way of example.

Firstly, while in the embodiment described above, each logical block may become associated with two physical blocks, a first alternative embodiment of the invention may be formed in which this is not the case. In this case, no logical block ever becomes associated with a secondary block, and so both PRI_MAP and SRC_MAP only take values 0 or 1. This first alternative embodiment be considered as equivalent to the embodiment as described above in the case that the number of SA_STRUCT elements is zero. From an alternative point of view, in the first alternative embodiment the flow diagrams above are modified as follows:

(a) In FIG. 22, elements L9 to L11 are deleted. That is, if the determination at step L3 is negative, then the method terminates.
(b) In FIG. 23, steps W2 and W7 to W9 are omitted.
(c) In FIG. 24, steps R5 and R8 are omitted.
FIG. 25 is not employed in the first alternative embodiment.

Secondly, alternative embodiments include variations of the NVRAM structures, while still storing the most important elements of data. It is apparent from those skilled in the art that there are alternative means of forming tags or indicators in the NVRAM structures, and alternative organizations of the mapping structures, to essentially indicate if a logical block is unmapped, mapped to one physical block or mapped to two physical blocks, and corresponding pointers indicating the next free physical page of the mapped physical block(s) when writing to any logical page of associated logical block.

The invention claimed is:

1. A memory system having:
a non-volatile solid-state memory for storing user data, the non-volatile memory having a plurality of physical blocks, each physical block being organized into a plurality of physical pages, each physical block being erasable as a unit and each physical page being writable and readable as a unit,
a mapping data memory arranged to store:
(i) first mapping data indicating, for each of a plurality of logical blocks, a mapping between each logical block and a corresponding first one of said physical blocks, each of said logical blocks being organized into a plurality of logical pages;
(ii) for each of said logical blocks, a respective first page pointer for indicating a free page of the corresponding first physical block, and
(iii) second mapping data indicating for each logical page of each of said logical blocks, the physical page of the corresponding first physical block to which data in respect of that logical page was last written; and
a memory controller arranged to perform a write operation in relation to any logical page of any of said logical blocks, said write operation in relation to any given logical page including the steps of:
(a) using the respective first page pointer to identify a free physical page of the corresponding first physical block,
(b) writing data to the identified physical page,
(c) updating the second mapping data to indicate the identified physical page as the physical page to which data in respect of the given logical page was last written; and
(d) updating the respective first page pointer to indicate a new free physical page of the corresponding first physical block.

2. A memory system according to claim 1 wherein the memory controller is arranged in said write operation to perform an additional step (e) of writing in said identified physical page identity data indicating the identity of the given logical page.

3. A memory system according to claim 1 in which at least a portion of said mapping data memory is stored in a random access memory.

4. A memory system according to claim 3 in which at least a portion of said mapping data memory is stored in a non-volatile random access memory.

5. A memory system according to claim 1 in which at least a portion of said mapping data memory is within said non-volatile solid state memory.

6. A memory system according to claim 1 wherein the mapping data memory is arranged to store:
a table having a plurality of entries, wherein each entry is uniquely addressable by and associated with one of said logical blocks, and wherein each entry has a field for registering said page pointer.

7. A memory system according to claim 6 wherein:
each said entry has a field for registering said corresponding first physical block; and
said page pointer and said fields are portions of a single first table.

8. A memory system according to claim 7 wherein the first table is stored in a non-volatile random access memory.

9. A memory system according to claim 7 in which:
each said entry further includes a first tag for indicating whether the corresponding logical block is associated with a first physical block.

10. A memory system according to claim 1 wherein the mapping data memory is arranged to store:
a table having a plurality of entries, wherein each entry is uniquely addressable by and associated with one of said logical blocks, and wherein each entry has a field for registering said corresponding first physical block.

11. A memory system having:
a non-volatile solid-state memory for storing user data, the non-volatile memory having a plurality of physical blocks, each physical block being organized into a plurality of physical pages, each physical block being erasable as a unit and each physical page being writable and readable as a unit,
a mapping data memory arranged to store:
(i) first mapping data indicating, for each of a plurality of logical blocks, a mapping between each logical block and a corresponding first one of said physical blocks, each of said logical blocks being organized into a plurality of logical pages;
(ii) for each of said logical blocks, a respective first page pointer for indicating a free page of the corresponding first physical block, and
a memory controller arranged to perform a write operation in relation to any logical page of any of said logical blocks, said write operation in relation to any given logical page including the steps of:
(a) using the respective first page pointer to identify a free physical page of the corresponding first physical block,
(b) writing user data to the identified physical page,
(c) writing in said identified physical page identity data indicating the identity of the given logical page; and
(d) updating the pointer according to a predefined sequence;
whereby the user data and identity data written to said identified physical page supersede any user data and identity data in a physical page of the corresponding first physical block previously associated with the logical page.

12. A memory system according to claim 11 in which at least a portion of said mapping data memory is stored in a random access memory.

13. A memory system according to claim 12 in which at least a portion of said mapping data memory is stored in a non-volatile random access memory.

14. A memory system according to claim 11 in which at least a portion of said mapping data memory is within said non-volatile solid state memory.

15. A memory system according to claim 11 wherein the mapping data memory is arranged to store:
a table having a plurality of entries, wherein each entry is uniquely addressable by and associated with one of said logical blocks, and wherein each entry has a field for registering said page pointer.

16. A memory system according to claim 11 wherein the mapping data memory is arranged to store:
a table having a plurality of entries, wherein each entry is uniquely addressable by and associated with one of said logical blocks, and wherein each entry has a field for registering said corresponding first physical block.

17. A memory system according to claim 16 wherein:
each said entry has a field for registering said corresponding first physical block; and
said page pointer and said fields are portions of a single first table.

18. A memory system according to claim 17 wherein the first table is stored in a non-volatile random access memory.

19. A memory system according to claim 17 in which:
each said entry further includes a first tag for indicating whether the corresponding logical block is associated with a first physical block.

20. A memory system having:
a non-volatile solid-state memory for storing user data, the non-volatile memory having a plurality of physical blocks, each physical block being organized into a plurality of physical pages, each physical block being erasable as a unit and each physical page being writable and readable as a unit,
a mapping data memory storing data indicating, for each of a plurality of logical blocks, a mapping between the logical blocks and corresponding first ones of physical blocks, each of said logical blocks being organized into a plurality of logical pages;
a memory controller arranged to perform a write operation in relation to any logical page of any of said logical blocks, said write operation comprising storing data relating to any of said logical page of a first logical block in a physical page of the corresponding first physical block,
said memory controller being arranged, upon a physical block fullness criterion being met in respect of the first physical block, to associate a second physical block with the first logical block, and subsequently to write data relating to logical pages of the first logical block in pages of the second physical block, whereby data for at least one logical page of the first logical block remains stored in the first physical block and data for at least one other logical page of the first logical block is stored in the second physical block.

21. A memory system according to claim 20 in which at least a portion of said mapping data memory is a random access memory.

22. A memory system according to claim 21 in which at least a portion of said mapping data memory is a non-volatile random access memory.

23. A memory system according to claim 20 in which said physical block fullness criterion is that all pages of said first physical block have been written to.

24. A memory system according to claim 20 wherein upon a second physical block fullness criterion being met, data corresponding to said at least one logical page which remains stored in the first physical block and data corresponding to said at least one logical page stored in the second physical block, are moved to an erased third physical block, and first logical block is mapped to a third physical block.

25. A memory system according to claim 24 wherein said second physical block fullness criterion is that all the pages of said second physical block have been written to.

26. A memory system according to claim 24 which is operative, upon completion of said move operation, to erase the first and second physical block.

27. A memory system having:
a non-volatile memory for storing user data, the non-volatile memory having a plurality of physical blocks, each physical block being organized into a plurality of physical pages, each physical block being erasable as a unit and each physical page being writable and readable as a unit,
a mapping data memory arranged to store:
(i) first mapping data indicating, for each of the plurality of logical blocks, a mapping between each logical block and a corresponding first one of said physical blocks, each of said logical blocks being organized into a plurality of logical pages;
(ii) third mapping data indicating, for at least one of the plurality of logical blocks, a mapping between each of said at least one of the plurality of logical blocks and a corresponding second one of said physical blocks;
a memory controller arranged to perform a write operation into the non-volatile solid-state memory of user data in relation to any specified one of the plurality of logical blocks,
said write operation including, in the case of a logical block which is one of said at least one logical blocks, writing user data into a determined one of the corresponding first and second physical blocks.

28. A memory system according to claim 27 in which said write operation including, in the case of a logical block which is one of said at least one logical blocks, the steps of:
(a) determining if a fullness criterion in respect of first physical block is met;
(b) if determination in (a) is negative, identifying a physical page of the corresponding first physical block;
(c) if determination in (a) is positive, identifying a physical page of the corresponding second physical block; and
(d) writing user data to the identified physical page.

29. A memory system according to claim 28 in which the memory controller is operative, upon receiving a write command specifying a write operation in respect of a plurality of logical pages of a given logical block, to determine said fullness criterion would be met if user data in respect of some, but not all, the specified logical pages is written to the first physical block, and if said determination is positive writing data in respect of some of said specified logical pages to the first physical block and data in respect of other of said logical pages to the second physical block.

30. A memory system according to claim 27 wherein said third mapping data is stored in a non-volatile random access memory.

31. A memory system comprising:
a first non-volatile memory for storing user data, the first non-volatile memory having a plurality of physical blocks each individually erasable as a unit and each individually organized into a plurality of uniquely addressable physical pages of storage elements,
a memory controller responsive to commands for accessing user data in the first non-volatile memory, said controller being operative on logical blocks, each logical block being organized into a plurality of logical pages,
a plurality of mapping structures associated with respective said logical blocks, each of said mapping structures including a first field arranged to store the identity of a respective one of said physical blocks and a second field arranged to store a page pointer, each said page pointer identifying a free physical page of the physical block specified by the corresponding first field, for each logical page of each of said logical blocks, a corresponding logical address indicator arranged to store a logical identity of the physical page to which user data associated with the logical page was most recently written.

32. A memory system according to claim 31 wherein said logical address indicator is stored in the overhead field of the most recently written physical page of associated logical page.

33. A memory system according to claim 31 wherein said logical address indicator is stored in a non-volatile random access memory.

34. A memory system according to claim 31 wherein, upon a write operation relating to any said logical page of a logical block, the corresponding page pointer is updated to identify a new free physical page of the physical block specified by the corresponding first field.

35. A memory system according to claim 31 wherein said plurality of mapping structures are stored in a random access memory.

36. A memory system according to claim 35 wherein said random access memory is a non-volatile random access memory.

37. A memory system according to claim 31 wherein the first field and second field of each of said mapping structures are addressable together as a unit.

38. A memory system according to claim 31 wherein the first field and second field of each of said mapping structures are separately stored and individually addressable.

39. A memory system according to claim 31 wherein each of said mapping structures further includes an indicator identifying whether associated logical block is mapped to a physical block.

* * * * *